United States Patent
Syu et al.

(10) Patent No.: US 12,254,257 B2
(45) Date of Patent: Mar. 18, 2025

(54) HIGH VOLTAGE GUARD RING SEMICONDUCTOR DEVICE AND METHOD OF FORMING SAME

(71) Applicant: TAIWAN SEMICONDUCTOR MANUFACTURING COMPANY, LTD., Hsinchu (TW)

(72) Inventors: Ming-Cheng Syu, Hsinchu (TW); Po-Zeng Kang, Hsinchu (TW); Yung-Hsu Chuang, Hsinchu (TW); Shu-Chin Tai, Hsinchu (TW); Wen-Shen Chou, Hsinchu (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 428 days.

(21) Appl. No.: 17/581,810

(22) Filed: Jan. 21, 2022

(65) Prior Publication Data
US 2023/0043245 A1 Feb. 9, 2023

Related U.S. Application Data

(60) Provisional application No. 63/226,825, filed on Jul. 29, 2021.

(51) Int. Cl.
*G06F 30/30* (2020.01)
*G06F 30/38* (2020.01)
*G06F 30/392* (2020.01)
*H01L 27/02* (2006.01)

(52) U.S. Cl.
CPC ............ *G06F 30/38* (2020.01); *G06F 30/392* (2020.01); *H01L 27/0207* (2013.01)

(58) Field of Classification Search
None
See application file for complete search history.

(56) References Cited

U.S. PATENT DOCUMENTS

| | | | |
|---|---|---|---|
| 7,260,442 B2 | 8/2007 | Hwang et al. | |
| 8,957,496 B2 * | 2/2015 | Li | H01L 29/404 257/500 |
| 9,256,709 B2 | 2/2016 | Yu et al. | |
| 9,530,835 B1 * | 12/2016 | Khor | H01L 27/0207 |
| 10,714,384 B2 * | 7/2020 | Yang | H01L 25/0655 |

(Continued)

*Primary Examiner* — Leigh M Garbowski
(74) *Attorney, Agent, or Firm* — Hauptman Ham, LLP

(57) ABSTRACT

A method of manufacturing a semiconductor device includes forming M_1st segments in a first metallization layer including: forming first and second M_1st segments for which corresponding long axes extend in a first direction and are substantially collinear, the first and second M_1st segments being free from another instance of M_1st segment being between the first and second M_1st segments; and (A) where the first and second M_1st segments are designated for corresponding voltage values having a difference equal to or less than a reference value, separating the first and second M_1st segments by a first gap; or (B) where the first and second M_1st segments are designated for corresponding voltage values having a difference greater than the reference value, separating the first and second M_1st segments by a second gap, a second size of the second gap being greater than a first size of the first gap.

20 Claims, 20 Drawing Sheets

(56) References Cited

U.S. PATENT DOCUMENTS

| | | |
|---|---|---|
| 2014/0040838 A1 | 2/2014 | Liu et al. |
| 2015/0278429 A1 | 10/2015 | Chang |
| 2020/0134125 A1* | 4/2020 | Huang .................. G06F 30/398 |
| 2022/0043957 A1* | 2/2022 | Biswas ............... H01L 27/0207 |
| 2022/0399437 A1* | 12/2022 | Kim .................... H01L 29/0619 |

* cited by examiner

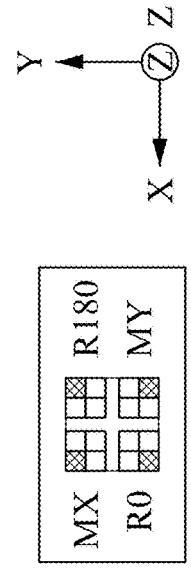

|  | Col. C1 | Col. C2 | Col. C3 | Col. C4 | Col. C5 | Col. C6 | Col. C7 | Col. C8 | Col. C9 | Col. C10 | Col. C11 |
|---|---|---|---|---|---|---|---|---|---|---|---|
| Row RW1 | 214e(R0) GRCe(R0) | 214f(R0) GRCf(R0) | 214i(R0) GRCi(R0) | 220d(R0) GRHd(R0) | 220i(R0) GRHi(R0) | 220f(R0) GRHf(R0) | 220i(MY) GRHi(MY) | 220d(MY) GRHd(MY) | 214i(MY) GRCi(MY) | 214f(MY) GRCf(MY) | 214e(MY) GRCe(MY) |
| Row RW2 | 216e(MX) GRVe(MX) | 216f(MX) GRVf(MX) | 216i(MX) GRVi(MX) | 219d(MX) CPDd(MX) | 219i(MX) CPDi(MX) | 222(MX) ACT(MX) | 219i(R180) CPDi(R180) | 219d(R180) CPDd(R180) | 216i(R180) GRVi(R180) | 216f(R180) GRVf(R180) | 216e(R180) GRVe(R180) |
| Row RW3 | 216e(R0) GRVe(R0) | 216f(R0) GRVf(R0) | 216i(R0) GRVi(R0) | 219d(R0) CPDd(R0) | 219i(R0) CPDi(R0) | 222(R0) ACT(R0) | 219i(MY) CPDi(MY) | 219d(MY) CPDd(MY) | 216i(MY) CPVi(MY) | 216f(MY) CPVf(MY) | 216e(MY) CPVe(MY) |
| Row RW4 | 216e(MX) GRVe(MX) | 216f(MX) GRVf(MX) | 216i(MX) GRVi(MX) | 219d(MX) CPDd(MX) | 219i(MX) CPDi(MX) | 222(MX) ACT(MX) | 219i(R180) CPDi(R180) | 219d(R180) CPDd(R180) | 216i(R180) CPVi(R180) | 216f(R180) CPVf(R180) | 216e(R180) CPVe(R180) |
| Row RW5 | 218e(R0) GRV1e(R0) | 218f(R0) GRV1f(R0) | 218i(R0) GRVi(R0) | 221d(R0) GRJd(R0) | 221i(R0) GRHi(R0) | 221f(R0) GRHf(R0) | 221i(MY) GRHi(MY) | 221d(MY) GRJd(MY) | 218i(MY) GRVi(MY) | 218f(MY) CPVf(MY) | 218e(MY) CPVe(MY) |
| Row RW6 | 216e(R0) GRVe(R0) | 216f(R0) GRVf(R0) | 216i(R0) GRVi(R0) | 219d(R0) CPDd(R0) | 219i(R0) CPDi(R0) | 222(R0) ACT(R0) | 219i(MY) CPDi(MY) | 219d(MY) CPDd(MY) | 216i(MY) CPVi(MY) | 216f(MY) CPVf(MY) | 216e(MY) CPVe(MY) |
| Row RW7 | 216e(MX) GRVe(MX) | 216f(MX) GRVf(MX) | 216i(MX) GRVi(MX) | 219d(MX) CPDd(MX) | 219i(MX) CPDi(MX) | 222(MX) ACT(MX) | 219i(R180) CPDi(R180) | 219d(R180) CPDd(R180) | 216i(R180) CPVi(R180) | 216f(R180) CPVf(R180) | 216e(R180) CPVe(R180) |
| Row RW8 | 216e(R0) GRVe(R0) | 216f(R0) GRVf(R0) | 216i(R0) GRVi(R0) | 219d(R0) CPDd(R0) | 219i(R0) CPDi(R0) | 222(R0) ACT(R0) | 219i(MY) CPDi(MY) | 219d(MY) CPDd(MY) | 216i(MY) CPVi(MY) | 216f(MY) CPVf(MY) | 216e(MY) CPVe(MY) |
| Row RW9 | 216e(MX) GRVe(MX) | 216f(MX) GRVf(MX) | 216i(MX) GRVi(MX) | 219d(MX) CPDd(MX) | 219i(MX) CPDi(MX) | 222(MX) ACT(MX) | 219i(R180) CPDi(R180) | 219d(R180) CPDd(R180) | 216i(R180) CPVi(R180) | 216f(R180) CPVf(R180) | 216e(R180) CPVe(R180) |
| Row RW10 | 214e(MX) GRCe(MX) | 214f(MX) GRCf(MX) | 214i(MX) GRCi(MX) | 220d(MX) GRHd(MX) | 220i(MX) GRHi(MX) | 220f(MX) GRHf(MX) | 220i(R180) GRHi(R180) | 220d(R180) GRHd(R180) | 214i(R180) GRCi(R180) | 214f(R180) GRCf(R180) | 214e(R180) GRCe(R180) |

FIG. 2

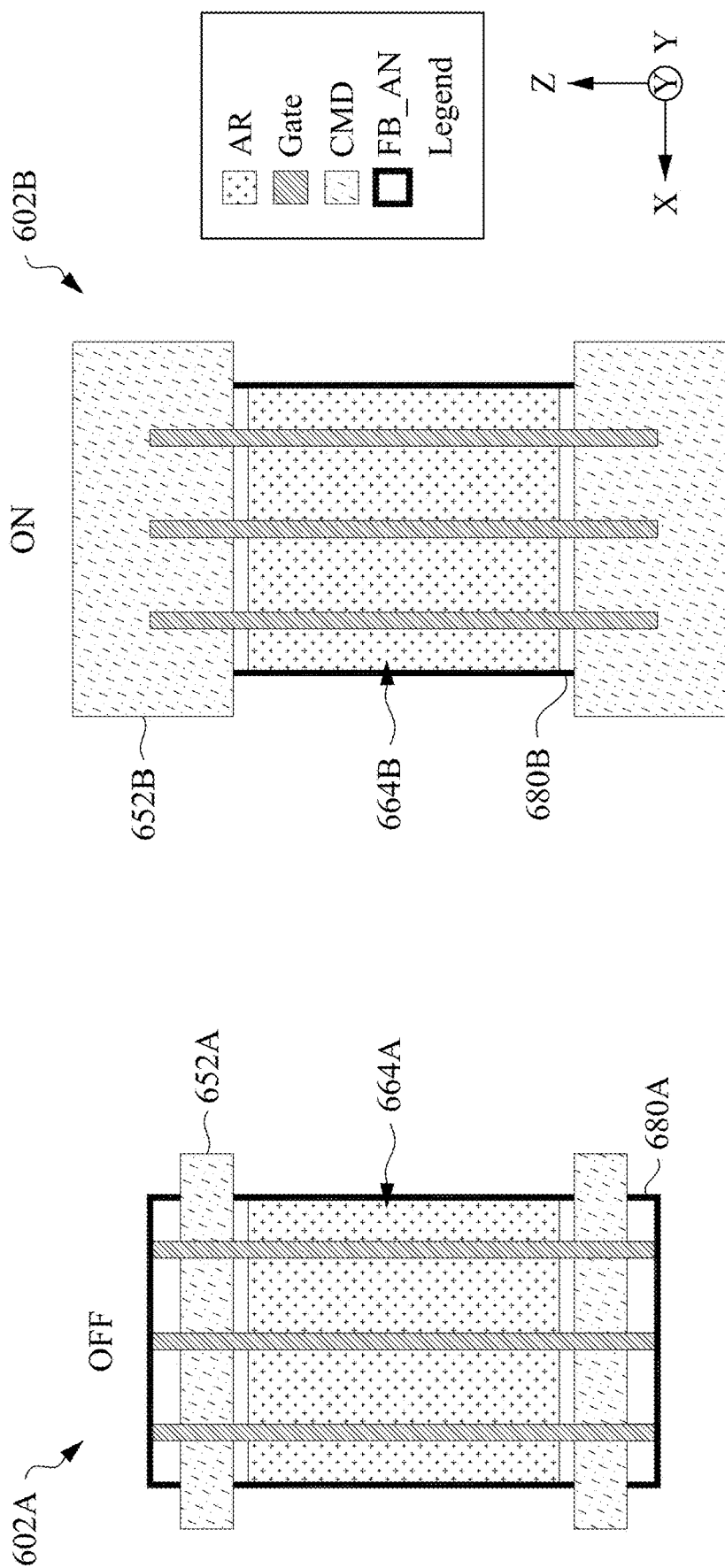

HIGH VOLTAGE GUARD RING SEMICONDUCTOR DEVICE AND METHOD OF FORMING SAME

PRIORITY CLAIM

This application claims the benefit of U.S. Provisional Application No. 63/226,825, filed on Jul. 29, 2021, the disclosure of which is hereby incorporated by reference in its entirety.

BACKGROUND

The semiconductor integrated circuit (IC) industry produces a variety of analog and digital devices to address issues in a number of different areas. Developments in semiconductor process technology nodes have progressively reduced component sizes and tightened spacing resulting in progressively increased transistor density. ICs have become smaller.

In general, regarding IC architecture, guard rings serve purposes including providing electrical isolation and/or spatial isolation between adjacent circuit elements. For example, guard rings are placed between digital and analog sections, or between digital and RF sections, in a mixed signal IC to reduce the degree to which noise (e.g., carrier injection) from the digital circuitry affects the analog circuit or RF circuitry.

In electronics engineering, design rules are geometric constraints imposed to ensure that designs function properly, function reliably, and/or achieve acceptable yield when the designs are fabricated as corresponding semiconductor devices. For a given semiconductor process technology node, design rules for production are developed by process engineers based on the capability of the corresponding processes to realize design intent. Electronic design automation (EDA) is used to verify that designers do not violate design rules, wherein such a verification process is referred to as design rule checking (DRC). Among other things, DRC includes LVS (layout versus schematic) checks, XOR (logic) checks, ERC (electrical rule check), antenna checks (charge accumulation on metal layers), or the like.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 2 is a block diagram of an IC, in accordance with some embodiments.

FIGS. 6A and 6B are corresponding layout diagrams of a semiconductor device, in accordance with some embodiments.

DETAILED DESCRIPTION

Figure 1:
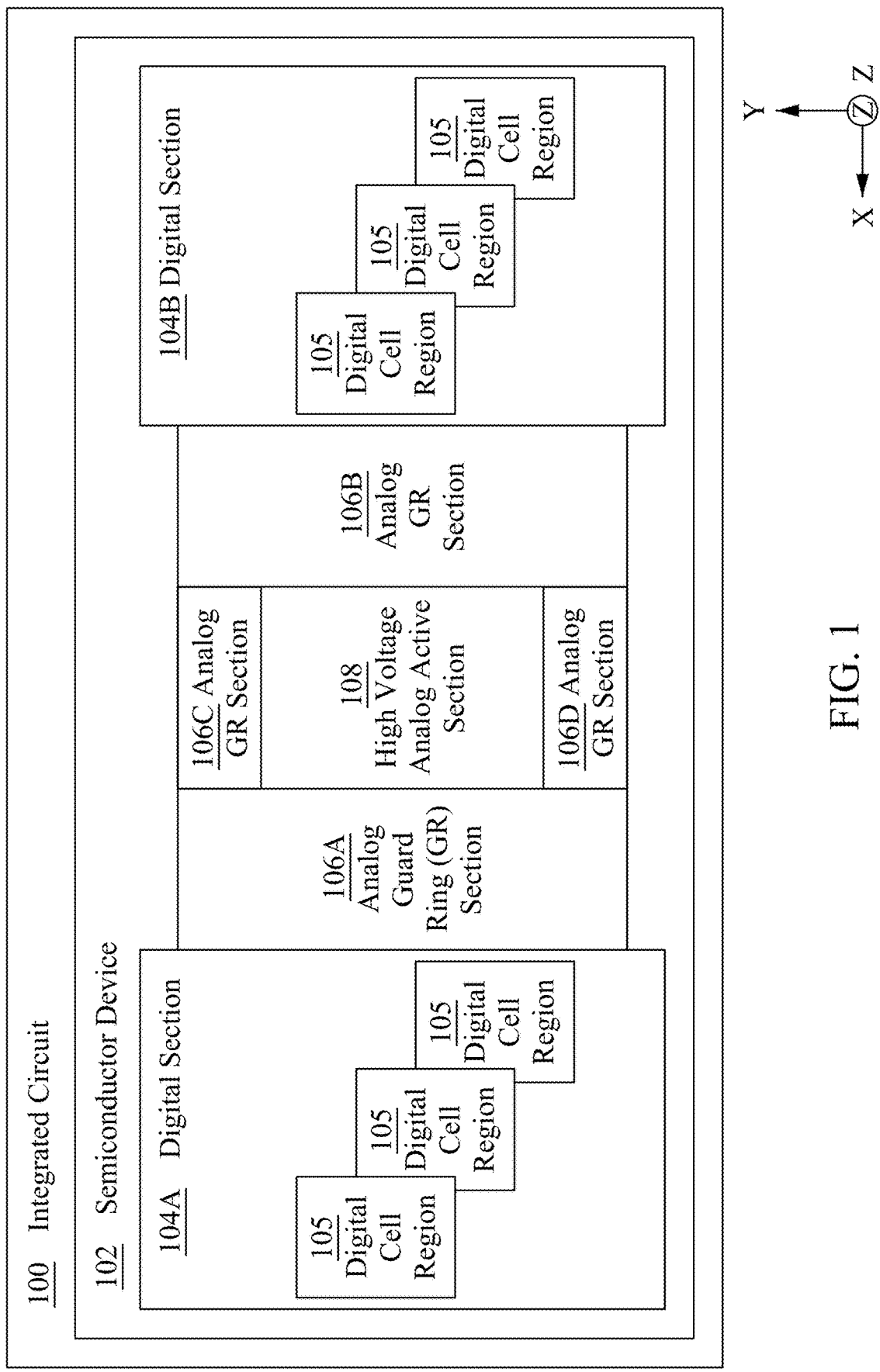
FIG. 1 is a block diagram of an integrated circuit (IC), in accordance with some embodiments.

The following disclosure discloses many different embodiments, or examples, for implementing different features of the subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may further include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In some embodiments, the term "standard cell structure" refers to a standardized building block included in a library of various standard cell structures. In some embodiments, various standard cell structures are selected from a library thereof and are used as components in a layout diagram representing a circuit.

In some embodiments, an IC includes a semiconductor device that includes an analog guard ring (GR) section including analog GR cells and an active (ACT) analog section including analog ACT cells. The semiconductor device includes segments in a first level of metallization (M_1st segments). The IC uses multiple minimum gap sizes relative to a first direction (e.g., parallel to the X-axis). The M_1st segments include first and second M_1st segments that have co-track (or substantially collinear) long axes extending in the direction of the X-axis and that are electrically connected to corresponding voltage values having a difference equal to or less than a standard voltage, e.g., a first reference value (Vr). For example, each of the first and second M_1st segments is in a GR cell, the first M_1st segment has a voltage value equal to the first reference value (Vr) and the second M_1st segment has a voltage value equal to a second reference value (Vgnd). In some embodiments, the first and second M_1st segments are described as abutted segments. In some embodiments, the reference value (Vr) represents a standard voltage value for a corresponding semiconductor process technology node, e.g., a voltage value used for the operation of digital circuits. In some embodiments, the reference value (Vgnd) is VSS for the corresponding semiconductor process technology node, where (Vgnd=VSS)<Vr. The first and second M_1st segments are separated by a first horizontal gap having a first size. The first size of the first horizontal gap ensures a minimum degree of electrical isolation between the first and second M_1st segments under circumstances in which a difference between voltage values levels correspondingly on the first and second M_1st segments is equal to or less than the first reference value (Vr). In some embodiments, the minimum degree of electrical isolation is such that electrical interference (e.g., carrier migration) is reduced to negligible levels, dielectric breakdown is avoided, or the like. The first size of the first horizontal gap is established by one or more design rules of the corresponding semiconductor process technology node. In such embodiments, the M_1st segments further include third and fourth M_1st segments that have co-track (or substantially collinear) long axes extending in the direction of the X-axis and that are electrically connected to corresponding voltage values having a difference greater than the reference value (Vr). In some embodiments, the third and fourth M_1st segments are described as abutted segments. For example, the third M_1st segment is in a GR cell and has a voltage value equal to the second reference value (Vgnd), and the fourth M_1st segment is in an ACT cell and has a voltage value equal to a third reference value (Vh), the third reference value (Vh) being not only greater than the second reference value (Vgnd), but also greater than the first reference value (Vr), i.e., Vgnd<Vr<Vh. In some embodiments, the third reference value (Vh) is about twice as large as the first reference value (Vr), i.e., Vh≈2*Vr. In some embodiments, Vh≈2.06*Vr. In some embodiments, Vgnd≈0 volts, Vr≈0.96 volts and Vh≈1.98 volts. The third and fourth M_1st segments are separated by a second horizontal gap having a second size, the second size of the second horizontal gap being greater than the first size of the first horizontal gap. The second size of the second horizontal gap ensures the minimum degree of electrical isolation between nearest abutted third and fourth M_1st segments under circumstances in which a difference between voltage values levels correspondingly on the third and fourth M_1st segments is equal to or less than the third reference value (Vh). The second size of the second horizontal gap is established by one or more design rules of the corresponding semiconductor process technology node.

According to another approach, the design rules of the corresponding semiconductor process technology node establish a single minimum horizontal gap between two co-track (or collinear) M_1st segments, i.e., two abutted M_1st segments. The single minimum horizontal gap for the two M_1st segments according to the other approach (single M_1st minimum horizontal gap) ensures a minimum degree of electrical isolation under circumstances in which is equal to or less than the standard voltage, e.g., the first reference value (Vr) for the corresponding semiconductor process technology node, e.g., when one of the two M_1st segments has a voltage value equal to the second reference value (Vgnd) and the other of the two M_1st segments has the standard voltage value equal to the first reference value (Vg), where VSS<Vg. Also according to the other approach, in a circumstance in which analog ACT cells are surrounded by a guard ring formed of analog GR cells, an M_1st segment in a GR cell is separated from corresponding nearest collinear M_1st segment in a corresponding ACT cell by the single M_1st minimum horizontal gap according to the other approach, with a result that a difference between voltage values levels on the two M_1st segments according to the other approach cannot be greater than the standard voltage value, i.e., the first reference value (Vg). The reason why the difference between voltage values levels on the two M_1st segments according to the other approach cannot be greater than the standard voltage value, i.e. the first reference value (Vg) is that otherwise the single M_1st minimum horizontal gap according to the other approach would fail to provide the minimum degree of electrical isolation between the M_1st segment in the GR cell and the corresponding nearest collinear M_1st segment in the ACT cell, e.g., resulting in more than a negligible level of electrical interference (e.g., carrier migration), dielectric breakdown, or the like. In other words, high voltage ACT cells cannot be used according to the other approach. By contrast, in addition to using the first horizontal gap having the first size, some embodiments of the present disclosure use the second horizontal gap having the second size, e.g., to facilitate using high voltage value ACT cells. More particularly, some embodiments of the present disclosure use the second horizontal gap between an M_1st segment in a GR cell and a nearest co-track M_1st segment in a corresponding GR cell in order to facilitate achieving the minimum degree of electrical isolation under circumstances in which a difference between voltage values levels correspondingly on the third and fourth M_1st segments is equal to or less than the third reference value (Vh). An example of such circumstances is where an M_1st segment in a GR cell has a voltage value equal to the second reference value (Vgnd) and a corresponding nearest substantially co-track (substantially collinear) M_1st segment in a corresponding ACT cell has a voltage value equal to the third reference value (Vh).

In some embodiments, the IC uses multiple minimum gap sizes relative to a second direction (e.g., parallel to the Y-axis) perpendicular to the first direction. The M_1st segments include fifth and sixth M_1st segments that have long axes extending in the first direction, that are overlapping each other relative to the first direction, that are free from another instance of M_1st segment being between the fifth and sixth M_1st segments relative to the Y-axis (e.g., parallel to the Y-axis) perpendicular to the first direction, and that are electrically connected to corresponding voltage values having a difference equal to or less than the first reference value (Vr). In some embodiments, the fifth and sixth M_1st segments are described as stacked segments. For example, each of the fifth and sixth M_1st segments is in a GR cell, the fifth M_1st segment has a voltage value equal to the first reference value (Vr) and the sixth M_1st segment has a voltage value equal to the second reference value (Vgnd). Relative to the Y-axis, the fifth and sixth M_1st segments are separated by a first vertical gap having a third size. The third size of the first vertical gap ensures the minimum degree of electrical isolation between the fifth and sixth M_1st segments under circumstances in which a difference between voltage values levels correspondingly on the fifth and sixth M_1st segments is equal to or less than the first reference value (Vr). The third size of the first vertical gap is established by one or more design rules of the corresponding semiconductor process technology node. In such embodiments, the M_1st segments further include seventh and eighth M_1st segments that have long axes extending in the first direction, that are overlapping each other relative to the first direction, that are free from another instance of M_1st segment being between the seventh and eighth M_1st segments relative to the Y-axis, and that are electrically connected to corresponding voltage values having a difference greater than the reference value (Vr). In some embodiments, the seventh and eighth M_1st segments are described as stacked segments. For example, the seventh M_1st segment is in a GR cell and has a voltage value equal to the second reference value (Vgnd), and the eighth M_1st segment is in an ACT cell and has a voltage value equal to the third reference value (Vh). Relative to the Y-axis, the seventh and eighth M_1st segments are separated by a second vertical gap having a fourth size, the fourth size of the second vertical gap being greater than the third size of the first vertical gap. The fourth size of the second vertical gap ensures the minimum degree of electrical isolation between the seventh and eighth M_1st segments under circumstances in which a difference between voltage values levels correspondingly on the seventh and eighth M_1st segments is equal to or less than the third reference value (Vh). The fourth size of the second vertical gap is established by one or more design rules of the corresponding semiconductor process technology node.

According to another approach, the design rules of the corresponding semiconductor process technology node establishes a single minimum vertical gap between two M_1st segments (single M_1st minimum vertical gap) that have long axes extending in the first direction, that are overlapping each other relative to the first direction, that are free from another instance of M_1st segment being between the fifth and sixth M_1st segments relative to the Y-axis, and that are electrically connected to corresponding voltage values having a difference equal to or less than the first reference value (Vr), i.e., two stacked M_1st segments. Because the other approach only uses a single M_1st minimum vertical gap, a difference between voltage values levels on the two stacked M_1st segments cannot be greater than the standard voltage value, i.e., the first reference value (Vg). By contrast, in addition to using the first vertical gap having the third size, some embodiments of the present disclosure use the second vertical gap having the fourth size, e.g., to facilitate using high voltage value ACT cells. More particularly, some embodiments of the present disclosure use the second vertical gap between an M_1st segment in a GR cell and a nearest stacked M_1st segment in a corresponding GR cell in order to facilitate achieving the minimum degree of electrical isolation under circumstances in which a difference between voltage values levels correspondingly on the seventh and eighth M_1st segments is equal to or less than the third reference value (Vh). An example of such circumstances is where an M_1st segment in a GR cell has a voltage value equal to the second reference value (Vgnd) and a corresponding nearest stacked M_1st segment in a corresponding ACT cell has a voltage value equal to the third reference value (Vh).

FIG. 1 is a block diagram of an integrated circuit (IC) 100, in accordance with some embodiments.

IC 100 includes a semiconductor device 102, the latter including digital sections 104A and 104B, analog guard ring (GR) sections 106A, 106B, 106C and 106D, and an analog active (ACT) section 108. Each of digital sections 104A and 104B includes digital cell regions 105. Each of GR sections 106A, 106B, 106C and 106D includes corresponding high voltage analog GR cell regions (see FIG. 2). Analog active (ACT) section 108 includes one or more analog ACT cell regions (see FIG. 2). In some embodiments, GR section 106C and/or GR section 106D is omitted. In some embodiments, ACT section 108 includes one or more level shifters, one or more current mirrors, one or more op amps, or the like.

In FIG. 1, in some embodiments, each of the GR cell regions in GR sections 106A, 106B, 106C and 10D has a highest voltage value equal to a first voltage value. In some embodiments, the first voltage value is the first reference value (Vr), discussed above. In some embodiments, each of the digital cell regions 105 in corresponding digital sections 104A and 104B has a highest voltage value equal to a first voltage value. In some embodiments, the first voltage value is the first reference value (Vr), discussed above. Each of the ACT cell regions has a highest voltage value equal to a second voltage value, the second voltage value being above the first voltage value. In some embodiments, the second voltage value is the first reference value (Vh), discussed above. In some embodiments, the second voltage value (V2) is about twice as large as the first voltage value (V1), i.e., $V2 \approx 2*V1$. In some embodiments, $V2 \approx 2.06*V1$. In some embodiments, $V1 \approx 0.96$ volts and $V2 \approx 1.98$ volts.

In FIG. 1, each of the GR cell regions in GR sections 106A-106D and the ACT cell regions in ACT section 108 includes corresponding segments in a first level of metallization (M_1st segments) (see FIGS. 3C, 3E, 7A, 7B, or the like). Relative to a first direction, e.g., parallel to the X-axis, for a first circumstance in which a difference between voltage values levels correspondingly on nearest substantially co-track (substantially collinear) first and second ones of the M_1st segments is equal to or less than the first reference value (Vr), the first and second M_1st segments are separated by the first horizontal gap relative to the X-axis, the first horizontal gap having the first size. Relative to the X-axis, for a second circumstance in which a difference between voltage values levels correspondingly on nearest substantially co-track (substantially collinear) third and fourth ones of the M_1st segments is equal to or less than the third reference value (Vh), the third and fourth M_1st segments are separated by the second horizontal gap relative to the X-axis, the second horizontal gap having the second size, the second size being greater than the first size. Reasons for using the first and second horizontal gaps according to some embodiments of the present disclosure, as contrasted with the single M_1st minimum horizontal gap according to the other approach, are discussed below. In some embodiments, the second size (G2) of the second horizontal gap is about eight times greater than the first size (G1) of the first horizontal gap, $G2 \approx 8*G1$. In some embodiments, $G2 \approx 8.1*G1$. In some embodiments, $G1 \approx 14$ nanometers (nm) and $G2 \approx 113$ nm.

In FIG. 1, relative to a second direction, e.g., parallel to the Y-axis, perpendicular to the first direction, for a third circumstance in which a difference between voltage values levels correspondingly on nearest fifth and sixth ones of the M_1st segments is equal to or less than the first reference value (Vr), the fifth and sixth M_1st segments are separated by the first vertical gap relative to the Y-axis, the third gap having the third size. Relative to the Y-axis, for a fourth circumstance in which a difference between voltage values levels correspondingly on nearest seventh and eighth ones of the M_1st segments is equal to or less than the third reference value (Vh), the seventh and eighth M_1st segments are separated by the fourth gap relative to the Y-axis, the fourth gap having the fourth size, the fourth size being greater than the third size. Reasons for using the third and fourth gaps according to some embodiments of the present disclosure, as contrasted with a single gap according to the other approach, are discussed below. In some embodiments, the fourth size (G4) of the fourth gap is about 1.8 times greater than the third size (G3) of the third gap, G4≈1.8*G3. In some embodiments, G4≈1.875*G3. In some embodiments, G4 is about twice G3, G4≈2*G3. In some embodiments, G4 is about 2.1 times G3, G4≈2.1*G3. In some embodiments, G4≈2.14*G3. In some embodiments, G3 is about 0.14 nm and G4 is about 0.03 nm. In some embodiments, G3 is about 0.16 nm and G4 is about 0.03 nm.

A digital circuit, e.g., as found in digital sections 104A and 104B, which includes field-effect transistors (FETs), e.g., metal oxide semiconductor FETs (MOSFETs). In such a digital circuit, the voltage value on a gate terminal of a MOSFET is selectively switched from rail to rail resulting in the MOSFET being either substantially completely turned off or substantially completely turned on in a binary manner. For example, the voltage value on a gate terminal of a MOSFET is selectively switched between a voltage value equal to the first reference value (Vr) and the second reference value (Vgnd). When turned on, a given portion of the substrate corresponding to the channel of the MOSFET is substantially completely depleted of the majority carriers of the substrate, such that the given portion of the substrate is referred to as the depletion region, and the corresponding temporary mode of operation of the MOSFET is referred to as depletion mode or saturation mode. When the channel is formed/induced, not only is the depletion region temporarily depleted of the majority carriers, the depletion region is temporarily augmented with the minority carriers of the substrate, i.e., the density of minority carriers in the depletion region is temporarily increased, which temporarily forms or induces a conductive channel in the substrate.

In an analog circuit, the amount of current that flows through the MOSFET, i.e., the degree to which the MOSFET is turned on, is varied in a continuous manner. The continuous manner of controlling current flow in the MOSFET of an analog circuit contrasts with the binary manner in which current is controlled to flow through a MOSFET in a digital circuit. In an analog circuit, temporary current flow through the MOSFET is continuously varied in proportion to the voltage value on the gate terminal of the MOSFET (gate voltage) such that the corresponding temporary mode of operation of the MOSFET is referred to as ohmic mode. More particularly, the degree to which the depletion region becomes depleted varies in proportion to the magnitude of the gate voltage, and ranges from being substantially incompletely depleted to being substantially completely depleted. In the ohmic mode, the gain of the MOSFET is sensitive to the potential difference between the gate voltage and a voltage value of the substrate. In the ohmic mode, a small change in the voltage value of the substrate can have a large effect on the degree to which the depletion region becomes depleted and thus the amount of current conducted through the channel.

In general, the architecture of FETs, e.g., MOSFETs, is susceptible to the temporary formation of parasitic bipolar junction transistors (BJTs) because, under some circumstances, the binary manner of operation tends to promote carrier injection. Under first circumstances, the binary manner of operation of the FET in digital circuit causes majority carrier injection, which can temporarily form a vertical parasitic BJT. Under second circumstances, the binary manner of operation of the FET in digital circuit causes minority carrier injection, which can temporarily form a lateral (horizontal) parasitic BJT. Latchup is a phenomenon experienced by FETs, e.g., MOSFETs, which results from the temporary formation of parasitic BJTs. During latchup, a low impedance path forms between a positive system voltage, e.g., first reference value (Vr), and a second system reference voltage, e.g., the second reference value (Vgnd), which causes excessive current flow.

The temporary formation of parasitic BJTs is a problem for digital circuits and analog circuits. Furthermore, before the injection of carriers rises to a level that causes the formation of parasitic BJTs, the injection of carriers due to the binary manner of operation of FETs in digital circuits poses an additional problem for the operation of FETs in adjacent analog circuits. The additional problem is caused by the migration of carriers in the substrate, which are injected by the FETs of the digital circuits, to the vicinity of the FETs of the analog circuits. The migrated carriers skew the potential difference between the gate voltage the digital circuit's FETs and the voltage value of the substrate in the vicinity of the digital circuit's FETs. Again, in the ohmic mode, a small change in the voltage value of the substrate in the vicinity of the analog circuit's FETs can have a large effect on the degree to which the depletion region of the analog circuit's FETs become depleted, and thus a large effect on the amount of current conducted through the channels of the analog circuit's FETs.

Among other uses, guard rings are used to reduce the degree to which noise (e.g., carrier injection) from digital circuits (e.g., such as in digital sections 104A and 104B) affects adjacent analog circuits. Surrounding analog circuits with a guard ring, i.e., placing analog circuits inside the guard ring, protects the analog circuits against noise (e.g., carrier injection) from digital circuits that are adjacent albeit outside the guard ring. According to the other approach which only uses a single M_1st gap for abutted M_1st segments, it is not possible to operate the analog circuits at a high voltage, e.g., the third reference value (Vh), while operating the guard ring at a standard voltage, e.g., the first reference value (Vr). Operating analog circuits at a high voltage, e.g., the third reference value (Vh), while operating the guard ring at a standard voltage, e.g., the first reference value (Vr), which is achieved by some embodiments of the present disclosure, nevertheless, further encourages carrier migration from the digital circuits to the analog circuits. Because the other approach only uses a single M_1st gap for abutted M_1st segments, a difference between voltage values levels on abutted M_1st segments, e.g., an M_1st segment in a GR cell and on a nearest collinear M_1st segment in a corresponding ACT cell, cannot be greater than the standard voltage value, i.e., the first reference value (Vg). By contrast, in addition to using the first gap having the first size for abutted M_1st segments, some embodiments of the present disclosure use the second gap having the second size for abutted M_1st segments, e.g., to facilitate using high voltage value ACT cells. More particularly, some embodiments of the present disclosure use the second gap between an M_1st segment in a GR cell and a nearest co-track M_1st segment in a corresponding GR cell in order to facilitate achieving the minimum degree of electrical isolation under circumstances in which a difference between voltage values levels correspondingly on the third and fourth M_1st segments is equal to or less than the third reference value (Vh). An example of such circumstances is where an M_1st segment in a GR cell has a voltage value equal to the second reference value (Vgnd) and a corresponding nearest substantially co-track (substantially collinear) M_1st segment in a corresponding ACT cell has a voltage value equal to the third reference value (Vh).

Similarly, according to the other approach which only uses a single M_1st gap for stacked M_1st segments, it is not possible to operate the analog circuits at a high voltage, e.g., the third reference value (Vh), while operating the guard ring at a standard voltage, e.g., the first reference value (Vr). Operating analog circuits at a high voltage, e.g., the third reference value (Vh), while operating the guard ring at a standard voltage, e.g., the first reference value (Vr), which is achieved by some embodiments of the present disclosure, nevertheless, further encourages carrier migration from the digital circuits to the analog circuits. Because the other approach only uses a single M_1st gap for stacked M_1st segments, a difference between voltage values levels on stacked M_1st segments, e.g., an M_1st segment in a GR cell and on a nearest collinear M_1st segment in a corresponding ACT cell, cannot be greater than the standard voltage value, i.e., the first reference value (Vg). By contrast, in addition to using the third gap having the third size for stacked M_1st segments, some embodiments of the present disclosure use the fourth gap having the fourth size for stacked M_1st segments, e.g., to facilitate using high voltage value ACT cells. More particularly, some embodiments of the present disclosure use the fourth gap between an M_1st segment in a GR cell and a nearest stacked M_1st segment in a corresponding GR cell in order to facilitate achieving the minimum degree of electrical isolation under circumstances in which a difference between voltage values levels correspondingly on the seventh and eighth M_1st segments is equal to or less than the third reference value (Vh). An example of such circumstances is where an M_1st segment in a GR cell has a voltage value equal to the second reference value (Vgnd) and a corresponding nearest stacked M_1st segment in a corresponding ACT cell has a voltage value equal to the third reference value (Vh).

IC 100 is referred to as a chip, or a microchip, and is a set of electronic circuits, or semiconductor devices, on one piece (e.g., wafer, chip, or substrate) of semiconductor material, usually silicon or other suitable materials within the contemplated scope of the present disclosure. IC 100 supports one or more transistors, e.g., metal oxide semiconductor field-effect transistors (MOSFETs), such as semiconductor device 102, integrated into a chip; however, other suitable transistors and electrical components are within the contemplated scope of the present disclosure. IC 100 is electrically coupled to, incorporates, or houses one or more semiconductor devices 102.

FIG. 2 is a block diagram of an IC 200, in accordance with some embodiments.

IC 200 is an example of IC 100. Semiconductor 202 is an example of semiconductor 102.

Semiconductor device 200 includes analog GR cell regions and analog ACT cell regions. The analog GR cell regions and analog ACT cell regions are arranged into corresponding analog GR sections and analog ACT sections similarly to FIG. 1.

In particular, cell regions at the intersection of rows RW1-RW5 and columns C1-C3 are an example analog GR section 106A of FIG. 1. Cell regions at the intersection of rows RW1-RW5 and columns C9-C11 are an example of analog GR section 106B of FIG. 1. Cell regions at the intersection of row RW1 and columns C4-C8 are an example of analog GR section 106C of FIG. 1. Cell regions at the intersection of row RW5 and columns C4-C8 are an example of analog GR section 106D of FIG. 1. Cell regions at the intersection of rows RW2-RW4 and columns C4-C8 are an example of analog ACT section 108 of FIG. 1.

Also, in particular, cell regions at the intersection of rows RW5-RW10 and columns C1-C3 are an example of analog GR section 106A of FIG. 1. Cell regions at the intersection of rows RW5-RW10 and columns C9-C11 are an example of analog GR section 106B of FIG. 1. Cell regions at the intersection of row RW5 and columns C4-C8 are also an example of analog GR section 106C of FIG. 1. Cell regions at the intersection of row RW10 and columns C4-C8 are an example of analog GR section 106D of FIG. 1. Cell regions at the intersection of rows RW6-RW9 and columns C4-C8 are an example of analog ACT section 108 of FIG. 1.

A first end 210 of semiconductor device 202 includes cell regions in columns C1-C3. A second end 212 of semiconductor device 202 includes cell regions in columns C9-C11.

FIG. 2 uses the following notation to indicate cell region orientation relative to the X-axis, Y-axis and Z-axis. Cell regions having the parenthetical label (R0) have a default orientation R0. Cell regions indicated with the parenthetical (MX) have an orientation that is rotated 180 degrees about/around the X-axis with respect to the default orientation R0. Cell regions indicated with the parenthetical (MY) have an orientation MY that is rotated 180 degrees about/around the Y-axis with respect to default orientation R0. Cell regions having the parenthetical label (R180) have an orientation R180 that is rotated 180 degrees about/around the Z-axis with respect to default orientation R0. In other words, the orientation R180 is the combination of the MX and MY orientations, namely the MX orientation with respect the default orientation R0 and then the MY rotation with respect to the MX rotation, or vice-versa. Other suitable orientations are within the contemplated scope of the present disclosure.

In FIG. 2, the intersection of row RW1 and columns C1-C3 includes GR corner cell (GRC) regions 214 which are used to form corner portions of the guard ring. More particularly, an e-type GRC cell region having the R0 orientation (GRCe (R0)) 214e(R0) (see FIG. 4B) is at the intersection of row RW1 and column C1. An f-type GRC cell region having the R0 orientation (GRCf (R0)) 214f(R0) (see FIG. 4C) is at the intersection of row RW1 and column C2. An i-type GRC cell region having the R0 orientation (GRCi (R0)) 214i(R0) (see FIG. 4D) is at the intersection of row RW1 and column C3.

In FIG. 2, intersections of row RW1 and columns C9-C11 also include GRC regions 214. More particularly, an i-type GRC cell region having the MY orientation (GRCi (MY)) 214i(MY) (see FIG. 4D) is at the intersection of row RW1 and column C9. An f-type GRC cell region having the MY orientation (GRCf (MY)) 214f(MY) (see FIG. 4C) is at the intersection of row RW1 and column C10. An e-type GRC cell region having the R0 orientation (GRCe (R0)) 214e(R0) (see FIG. 4B) is at the intersection of row RW1 and column C1.

The intersections of row RW1 and columns C1-C3 also include GRC regions 214. More particularly, an e-type GRC cell region having the MX orientation (GRCe (MX)) 214e (MX) (see FIG. 4B) is at the intersection of row RW1 and column C1. An f-type GRC cell region having the MX orientation (GRCf (MX)) 214f(MX) (see FIG. 4C) is at the intersection of row RW1 and column C2. An i-type GRC cell region having the MX orientation (GRCi (MX)) 214i(MX) (see FIG. 4D) is at the intersection of row RW1 and column C3.

In FIG. 2, intersections of row RW10 and columns C9-C11 also include GRC regions 214. More particularly, an i-type GRC cell region having the R180 orientation (GRCi (R180)) 214i(R180) (see FIG. 4D) is at the intersection of row RW10 and column C9. An f-type GRC cell region having the R180 orientation (GRCf (R180)) 214f(R180) (see FIG. 4C) is at the intersection of row RW10 and column C10. An e-type GRC cell region having the R0 orientation (GRCe (R0)) 214e(R0) (see FIG. 4B) is at the intersection of row RW10 and column C1.

In FIG. 2, intersections of rows RW2-RW4 and columns C1-C3 includes GR vertical (GRV) cell regions 216 which are used to form left-wall and right-wall portions of the guard ring. More particularly, an e-type GRC cell region having the MX orientation (GRVe (MX)) 216e(MX) (see FIG. 4B) is correspondingly at each of the intersections of row RW2 & column C1, and row RW4 & column C1. An e-type GRC cell region having the R0 orientation (GRVe (R0)) 216e(R0) (see FIG. 4B) is at the intersection of row RW3 & column C1. An f-type GRV cell region having the MX orientation (GRVf (MX)) 216f(MX) (see FIG. 4C) is correspondingly at each of the intersections of row RW2 & column C2, and row RW4 & column C2. An f-type GRC cell region having the R0 orientation (GRVf (R0)) 216f(R0) (see FIG. 4C) is at the intersection of row RW3 & column C2. An i-type GRV cell region having the MX orientation (GRVi (MX)) 216i(MX) (see FIG. 4D) is correspondingly at each of the intersections of row RW2 & column C2, and row RW4 & column C2. An i-type GRC cell region having the R0 orientation (GRVi (R0)) 216i(R0) (see FIG. 4D) is at the intersection of row RW3 & column C2.

In FIG. 2, intersections of rows RW2-RW4 and columns C9-C11 also include GRV regions 216. More particularly, an i-type GRV cell region having the R180 orientation (GRVi (R180)) 216i(R180) (see FIG. 4D) is correspondingly at each of the intersections of row RW2 & column C10, and row RW4 & column C10. An i-type GRC cell region having the MY orientation (GRVi (MY)) 216i(MY) (see FIG. 4D) is at the intersection of row RW3 & column C10. An f-type GRV cell region having the R180 orientation (GRVf (R180)) 216f(R180) (see FIG. 4C) is correspondingly at each of the intersections of row RW2 & column C10, and row RW4 & column C10. An f-type GRC cell region having the MY orientation (GRVf (MY)) 216f(MY) (see FIG. 4C) is at the intersection of row RW3 & column C10. An e-type GRC cell region having the R180 orientation (GRVe (R180)) 216e (R180) (see FIG. 4B) is correspondingly at each of the intersections of row RW2 & column C11, and row RW4 & column C11. An e-type GRC cell region having the MY orientation (GRVe (MY)) 216e(MY) (see FIG. 4B) is at the intersection of row RW3 & column C11.

In FIG. 2, intersections of rows RW6-RW9 and columns C1-C3 also include GRV cell regions 216. More particularly, an e-type GRC cell region having the MX orientation (GRVe (MX)) 216e(MX) (see FIG. 4B) is correspondingly at each of the intersections of row RW6 & column C1, and row RW8 & column C1. An e-type GRC cell region having the R0 orientation (GRVe (R0)) 216e(R0) (see FIG. 4B) is correspondingly at each of the intersections of row RW7 & column C1, and row RW9 & column C1. An f-type GRV cell region having the MX orientation (GRVf (MX)) 216f(MX) (see FIG. 4C) is correspondingly at each of the intersections of row RW6 & column C2, and row RW8 & column C2. An f-type GRC cell region having the R0 orientation (GRVf (R0)) 216f(R0) (see FIG. 4C) is correspondingly at each of the intersections of row RW7 & column C2, and row RW9 & column C2. An i-type GRV cell region having the MX orientation (GRVi (MX)) 216i(MX) (see FIG. 4D) is correspondingly at each of the intersections of row RW6 & column C2, and row RW8 & column C2. An i-type GRC cell region having the R0 orientation (GRVi (R0)) 216i(R0) (see FIG. 4D) is correspondingly at each of the intersections of row RW7 & column C2, and row RW9 & column C3.

In FIG. 2, intersections of rows RW6-RW9 and columns C11-C9 also include GRV cell regions 216. More particularly, an i-type GRV cell region having the R180 orientation (GRVi (R180)) 216i(R180) (see FIG. 4D) is correspondingly at each of the intersections of row RW6 & column C9, and row RW8 & column C9. An i-type GRC cell region having the MY orientation (GRVi (MY)) 216i(MY) (see FIG. 4D) is correspondingly at each of the intersections of row RW7 & column C9, and row RW9 & column C9. An f-type GRV cell region having the R180 orientation (GRVf (R180)) 216f(R180) (see FIG. 4C) is correspondingly at each of the intersections of row RW6 & column C10, and row RW8 & column C10. An f-type GRC cell region having the MY orientation (GRVf (MY)) 216f(MY) (see FIG. 4C) is correspondingly at each of the intersections of row RW7 & column C10, and row RW9 & column C10. An e-type GRC cell region having the R180 orientation (GRVe (R180)) 216e(R180) (see FIG. 4B) is correspondingly at each of the intersections of row RW6 & column C11, and row RW8 & column C11. An e-type GRC cell region having the MY orientation (GRVe (MY)) 216e(MY) (see FIG. 4B) is correspondingly at each of the intersections of row RW7 & column C11, and row RW9 & column C11.

In FIG. 2, intersections of row RW5 and columns C1-C3 includes GRV vertically-interior (GRVI) cell regions 218 which are abutted in the direction of the X-axis relative to one another. More particularly, an e-type GRVI cell region having the R0 orientation (GRVIe (R0)) 218e(R0) (see FIG. 4B) is at the intersection of row RW5 and column C1. An f-type GRVI cell region having the R0 orientation (GRVIf (R0)) 218f(R0) (see FIG. 4C) is at the intersection of row RW5 and column C2. An i-type GRVI cell region having the R0 orientation (GRVIi (R0)) 218i(R0) (see FIG. 4D) is at the intersection of row RW5 and column C3. In some embodiments, at the intersections of row RW5 and columns C1-C3, cell region GRVIe (R0) 218e(R0), GRVIf (R0) 218f(R0), and GRVIi (R0) 218i(R0) are replaced by corresponding cell regions GRVe (R0) 216e(R0), GRVf (R0) 216f(R0), and GRVi (R0) 216i(R0).

In FIG. 2, intersections of row RW5 and columns C9-C11 also include GRC regions 218. More particularly, an i-type GRC cell region having the MY orientation (GRCi (MY)) 218i(MY) (see FIG. 4D) is at the intersection of row RW5 and column C9. An f-type GRC cell region having the MY orientation (GRCf (MY)) 218f(MY) (see FIG. 4C) is at the intersection of row RW5 and column C10. An e-type GRC cell region having the R0 orientation (GRCe (R0)) 218e(R0) (see FIG. 4B) is at the intersection of row RW5 and column C1. In some embodiments, at the intersections of row RW5 and columns C9-C11, cell region GRVIi (MY) 218i(MY), GRVIf (MY) 218f(MY), and GRVIe (MY) 218e(MY) are replaced by corresponding cell regions GRVi (MY) 218i (MY), GRVf (MY) 218f(MY), and GRVe (MY) 218e(MY).

In FIG. 2, intersections of row RW1 and columns C4-C8 includes GR horizontal (GRH) cell regions 220 which are used to form top-wall and bottom-wall portions of the guard ring. More particularly, a d-type GRH cell region having the R0 orientation (GRHd (R0)) 220d(R0) (see FIG. 4E) is at the intersection of row RW1 and column C4.

An i-type GRH cell region having the R0 orientation (GRHi (R0)) 220i(R0) (see FIG. 4D) is at the intersection of row RW1 and column C5. An f-type GRH cell region having the R0 orientation (GRHf (R0)) 220f(R0) (see FIG. 4C) is at the intersection of row RW1 and column C6. An i-type GRH cell region having the MY orientation (GRHi (MY)) 220i (MY) (see FIG. 4D) is at the intersection of row RW1 and column C7. A d-type GRH cell region having the MY orientation (GRHd (MY)) 220d(MY) is at the intersection of row RW1 and column C8.

In FIG. 2, intersections of row RW10 and columns C4-C8 also include GRH cell regions 220. More particularly, a d-type GRH cell region having the MX orientation (GRHd (MX)) 220d(MX) is at the intersection of row RW10 and column C4. An i-type GRH cell region having the MX orientation (GRHi (MX)) 220i(MX) (see FIG. 4D) is at the intersection of row RW10 and column C5. An f-type GRH cell region having the MX orientation (GRHf (MX)) 220f (MX) (see FIG. 4C) is at the intersection of row RW10 and column C6. An i-type GRH cell region having the R180 orientation (GRHi (R180)) 220i(R180) (see FIG. 4D) is at the intersection of row RW10 and column C7. A d-type GRH cell region having the R180 orientation (GRHd (R180)) 220d(R180) is at the intersection of row RW10 and column C8.

In FIG. 2, intersections of row RW5 and columns C4-C8 includes GR horizontally-interior (GRI) cell regions 220 which are used to form interior wall portions of a guard ring, i.e., are used to form interior wall portions that are between analog ACT cell regions. More particularly, a d-type GRI cell region having the R0 orientation (GRId (R0)) 220d(R0) is at the intersection of row RW5 and column C4. An i-type GRI cell region having the R0 orientation (GRIi (R0)) 220i(R0) (see FIG. 4D) is at the intersection of row RW5 and column C5. An f-type GRI cell region having the R0 orientation (GRIf (R0)) 220f(R0) (see FIG. 4C) is at the intersection of row RW5 and column C6. An i-type GRI cell region having the MY orientation (GRIi (MY)) 220i(MY) (see FIG. 4D) is at the intersection of row RW5 and column C7. A d-type GRI cell region having the MY orientation (GRId (MY)) 220d(MY) is at the intersection of row RW5 and column C8.

In FIG. 2, intersections of rows RW2-RW4 and columns C4-C5 & C7-C8 includes analog active CPD cell regions 219. In each type (discussed below) of CPD cell region, an isolation dummy gate (FIG. 3C) is formed over one or both ends of each active region in the CPD cell region. An isolation dummy gate is a dielectric structure that includes one or more dielectric materials and functions as an electrical isolation structure. Accordingly, an isolation dummy gate is not a structure that is electrically conductive and so does not function, e.g., as a gate electrode of an active transistor. In some embodiments, an isolation dummy gate is an example of a structure included in a CPODE layout scheme. In some embodiments, CPODE is an acronym for continuous poly on diffusion edge. In some embodiments, CPODE is an acronym for continuous poly on oxide definition edge. In some embodiments, an isolation dummy gate is referred to as a dielectric gate structure. In some embodiments, an isolation dummy gate is based on a gate structure as a precursor. In some embodiments, an isolation dummy gate is formed by first forming a gate structure, e.g., a dummy gate structure, sacrificing/removing (e.g., etching) the gate structure to form a trench, (optionally) removing a portion of a substrate that previously had been under the gate structure to deepen the trench, and then filling the trench with one or more dielectric materials such that the physical dimensions of the resultant electrical isolation structure, i.e., the isolation dummy gate, are similar to the dimensions of the gate structure which was sacrificed.

More particularly regarding CPD cell regions, a d-type CPD cell region having the MX orientation (CPDd (MX)) 219d(MX) is correspondingly at each of the intersections of row RW2 & column C4, and row RW4 & column C4. A d-type CPD cell region having the R0 orientation (CPDd (R0)) 219d(R0) is at the intersection of row RW3 & column C4. A d-type CPD cell region having the R180 orientation (CPDd (R180)) 219d(R180) is correspondingly at each of the intersections of row RW2 & column C8, and row RW4 & column C8. A d-type CPD cell region having the MY orientation (CPDd (MY)) 219d(MY) is at the intersection of row RW3 & column C8. An i-type CPD cell region having the MX orientation (CPDi (MX)) 219i(MX) (see FIG. 4D) is correspondingly at each of the intersections of row RW2 & column C5, and row RW4 & column C5. An i-type CPD cell region having the R0 orientation (CPDi (R0)) 219i(R0) (see FIG. 4D) is at the intersection of row RW3 & column C5. An i-type CPD cell region having the R180 orientation (CPDi (R180)) 219i(R180) (see FIG. 4D) is correspondingly at each of the intersections of row RW2 & column C7, and row RW4 & column C7. An i-type CPD cell region having the MY orientation (CPDi (MY)) 219i(MY) (see FIG. 4D) is at the intersection of row RW3 & column C7.

In FIG. 2, intersections of rows RW6-RW9 and columns C4-C5 & C7-C8 also include analog active CPD cell regions 219. More particularly, a d-type CPD cell region having the MX orientation (CPDd (MX)) 219d(MX) (see FIG. 4E) is correspondingly at each of the intersections of row RW6 & column C4, and row RW8 & column C4. A d-type CPD cell region having the R0 orientation (CPDd (R0)) 219d(R0) (see FIG. 4E) is correspondingly at each of the intersections of row RW7 & column C4, and row RW9 & column C4. A d-type CPD cell region having the R180 orientation (CPDd (R180)) 219d(R180) (see FIG. 4E) is correspondingly at each of the intersections of row RW6 & column C8, and row RW8 & column C8. A d-type CPD cell region having the MY orientation (CPDd (MY)) 219d(MY) (see FIG. 4E) is correspondingly at each of the intersections of row RW7 & column C8 and row RW9 & column C8. An i-type CPD cell region having the MX orientation (CPDi (MX)) 219i(MX) (see FIG. 4D) is correspondingly at each of the intersections of row RW6 & column C5, and row RW8 & column C5. An i-type CPD cell region having the R0 orientation (CPDi (R0)) 219i(R0) (see FIG. 4D) is correspondingly at each of the intersections of row RW7 & column C5, and row RW9 & column C5. An i-type CPD cell region having the R180 orientation (CPDi (R180)) 219i(R180) (see FIG. 4D) is correspondingly at each of the intersections of row RW6 & column C7, and row RW8 & column C7. An i-type CPD cell region having the MY orientation (CPDi (MY)) 219i(MY) (see FIG. 4D) is correspondingly at each of the intersections of row RW7 & column C7, and row RW9 & column C7.

In FIG. 2, intersections of rows RW2-RW4 and column C6 include analog ACT cell regions 222. More particularly, an analog ACT cell region having the MX orientation (ACT (MX)) 222(MX) is correspondingly at each of the intersections of row RW2 & column C6, and row RW4 & column C6. An analog ACT cell region having the R0 orientation (ACT (R0)) 222(R0) is at the intersection of row RW3 & column C6.

In FIG. 2, intersections of rows RW6-RW9 and column C6 also include analog ACT cell regions 222. More particularly, an analog ACT cell region having the MX orientation (ACT (MX)) 222(MX) is correspondingly at each of the intersections of row RW6 & column C6, and row RW8 & column C6. An analog ACT cell region having the R0 orientation (ACT (R0)) 222(R0) is correspondingly at each of the intersections of row RW7 & column C6, and row RW9 & column C6.

Figure 3A:
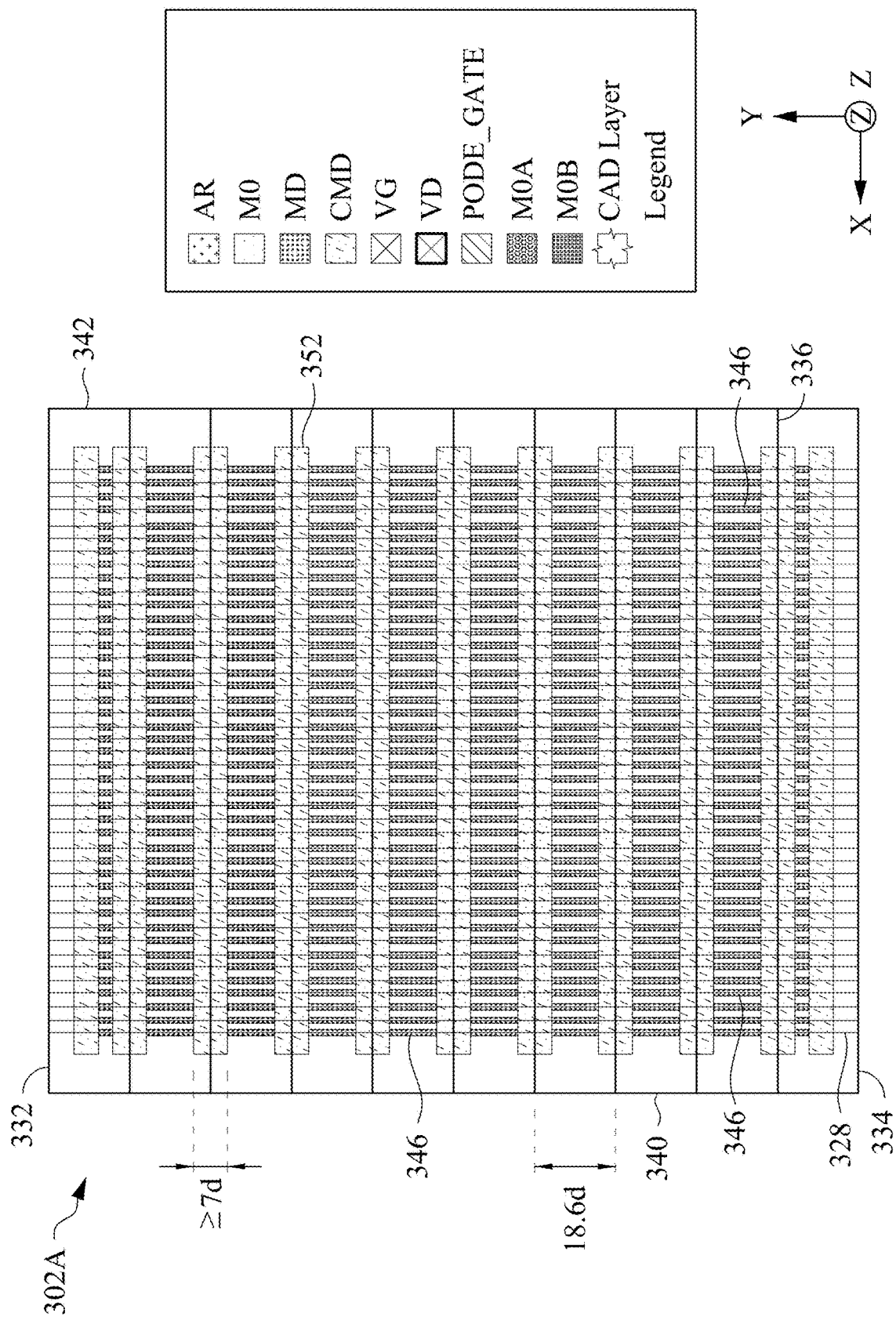
FIGS. 3A, 3B, 3C, and 3D are corresponding layout diagrams of a semiconductor device, in accordance with some embodiments.
Figure 3B:
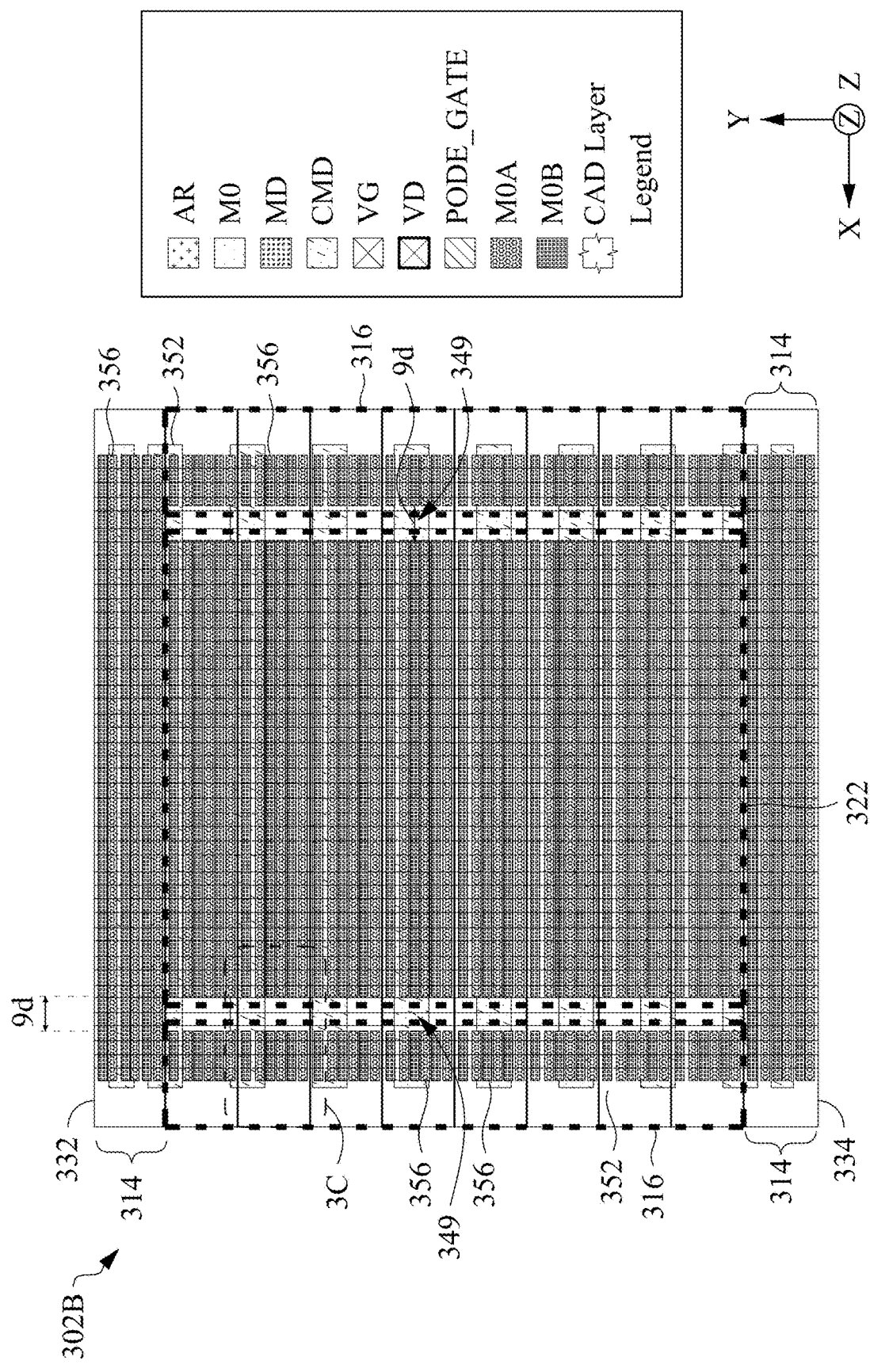
Figure 3C:
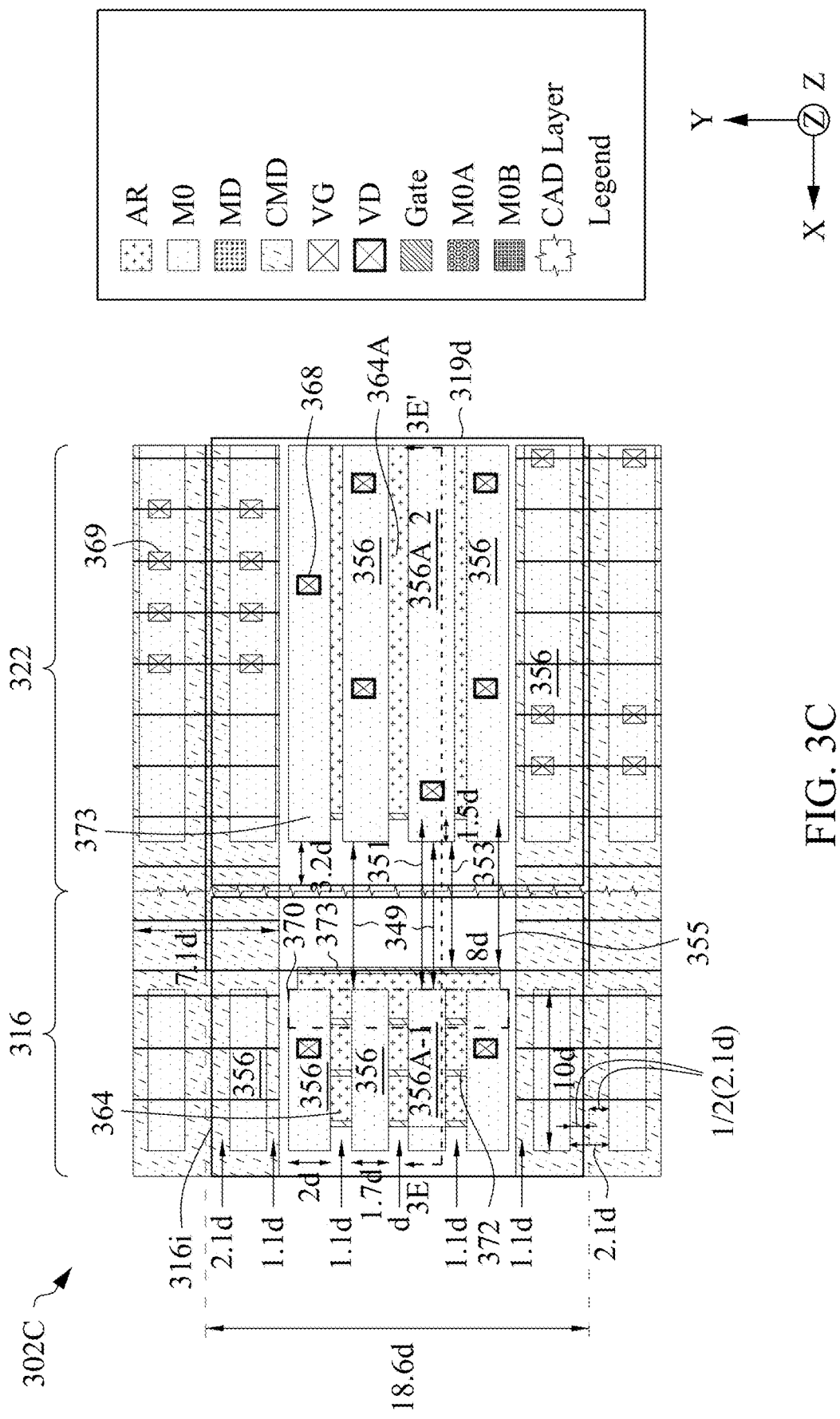

FIGS. 3A, 3B, and 3C are corresponding layout diagrams 302A, 302B and 302C of a corresponding semiconductor device, in accordance with some embodiments.

Figure 3D:
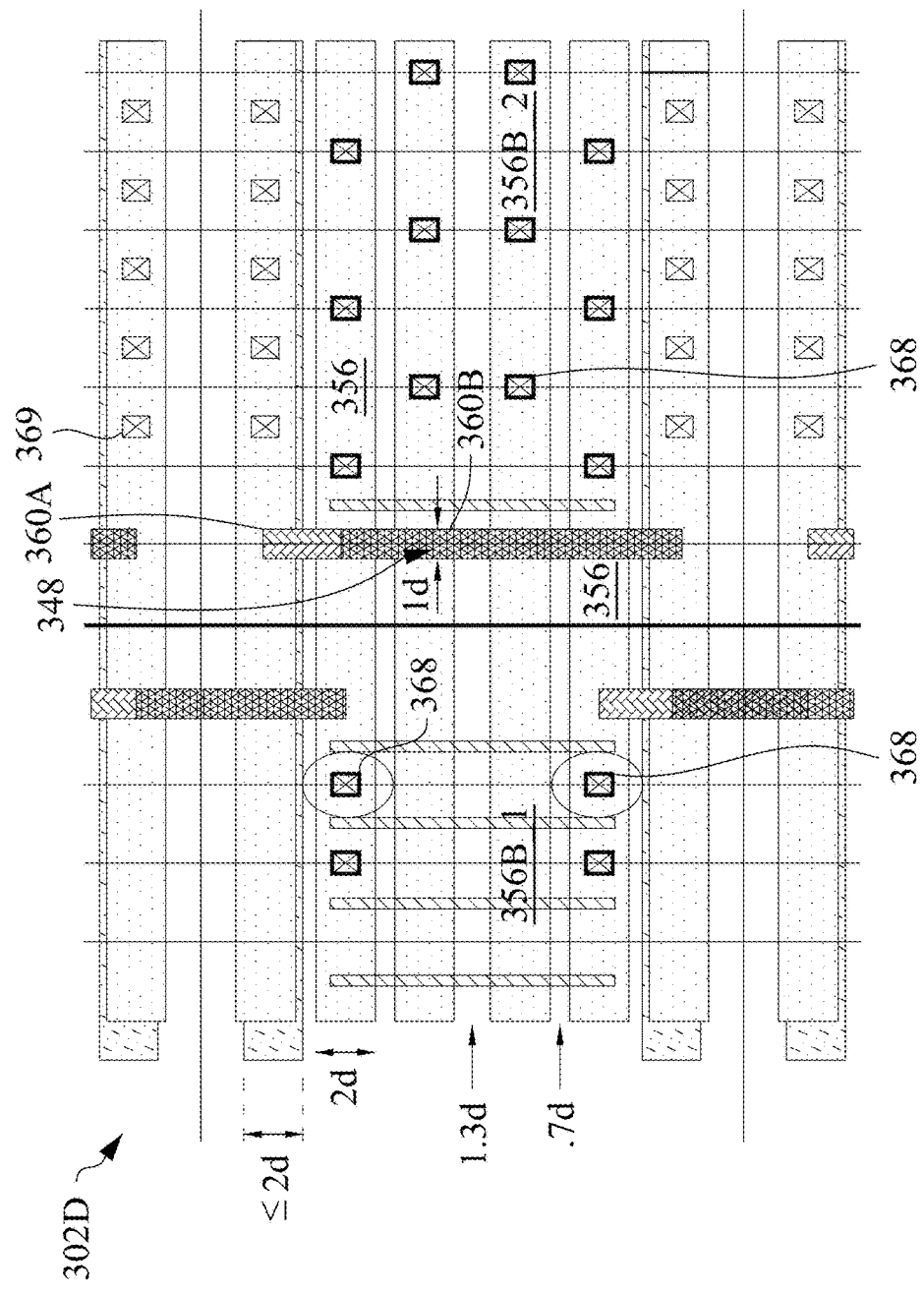
Figure 3E:
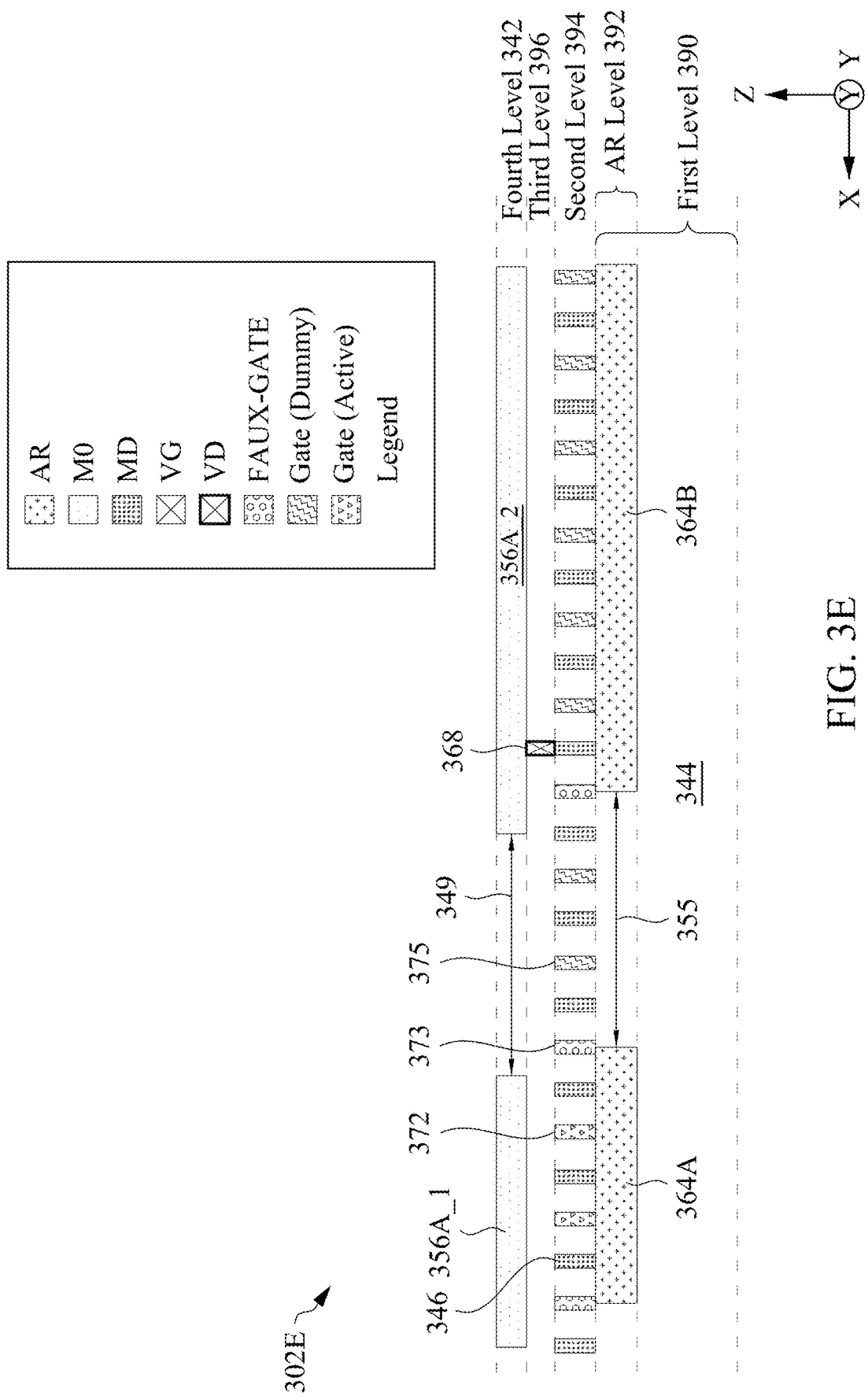
FIG. 3E is a cross sectional diagram of the semiconductor device of FIG. 3C taken along line 3E-3E', in accordance with some embodiments.

In FIG. 3A, layout diagram 302A represents structures in a few levels of the corresponding semiconductor device. In particular, layout diagram 302A represents structures included a first 390 level (FIG. 3E) and a second level 394 (FIG. 3E).

For purposes of discussion of layout diagram 302A, shapes and patterns within layout diagram 302A are discussed. Structures corresponding to the shapes and patterns of layout diagram 302A of a semiconductor device 402 are discussed in FIGS. 4A, 4B, 4C, and 4D.

Figure 4A:
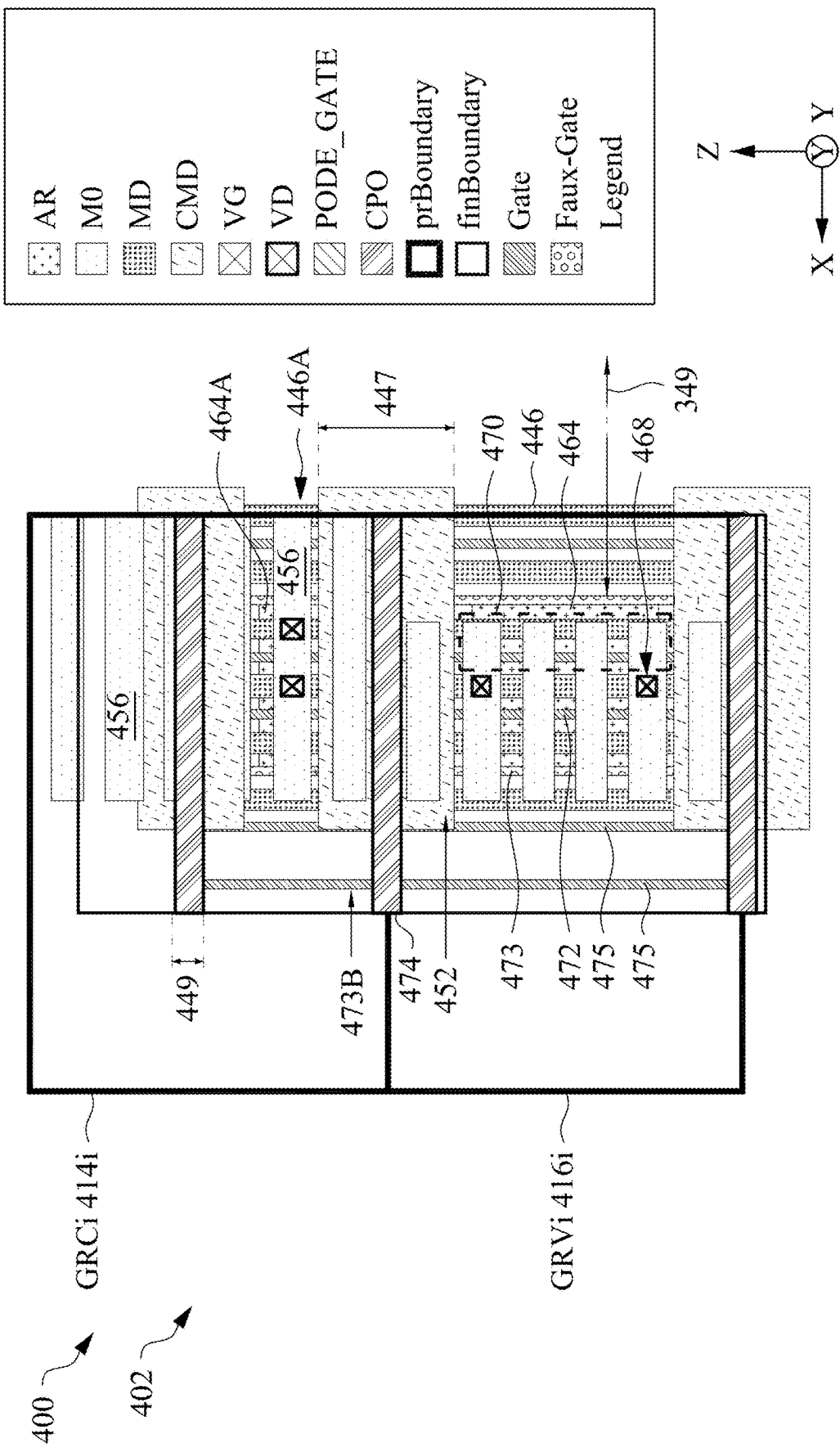
FIGS. 4A, 4B, 4C, 4D, 4E and 4F are corresponding layout diagrams of a semiconductor device, in accordance with some embodiments.

For example, layout diagram 302A is representative of semiconductor devices 102, 202 or 402 (FIG. 4A).

Layout diagram 302A is arranged according to vertical reference lines or tracks 328 that extend parallel to the Y-axis from an upper boundary line 332 to a lower boundary line 334. Further, Layout diagram 302A is arranged according to horizontal reference tracks 336 that extend in the X-axis from left-side boundary line 340 to an opposite, right-side boundary line 342.

Boundary lines 332, 334, 340, and 342 and reference tracks 328 and 336 are imaginary. Boundary lines 332, 334, 340, and 342 and reference tracks 328 and 336 are configured to be used for the orientation and placement of other shapes and patterns, such as metal over drain/source (MD) patterns 346, the latter being within second level 394 (FIG. 3E), the second level overlying first level 390 (FIG. 3E).

Layout diagram 302A further includes MD patterns 346 that extend in the direction of the Y-axis. In some embodiments, long axes of MD patterns 346 are aligned with corresponding vertical reference tracks 328. Each MD pattern 346 is separated from an adjacent MD pattern 346 relative to the X-axis. In some embodiments, MD patterns 346 are located on second level 394 (FIG. 3E). In some embodiments, MD patterns 346 are configured to be used to fabricate corresponding MD structures, and are over one or more corresponding AR patterns 364 and 364A (FIG. 3C). AR patterns 364 and 364A represent corresponding active regions 364 and 364A in AR level 392 of FIG. 3E.

In some embodiments, AR patterns 364 and 364A (FIG. 3C) are referred to as oxide diffusion (OD) region patterns. In some embodiments, portions of active regions are used to manufacture source or drain regions of one or more transistors. MD patterns 346 are over corresponding AR patterns. Other configurations or quantities of MD patterns 346 are within the scope of the present disclosure.

In FIG. 3A, layout diagram 302A further includes cut MD (CMD) patterns 352. CMD patterns 352 are disposed over portions of corresponding MD patterns 346, and indicate that corresponding portions of MD patterns 346 laying underneath CMD patterns 352 are intended to be cut, removed, or the like. With the exceptions of the uppermost and lowermost instances of CMD patterns 352, CMD patterns 352 are aligned correspondingly with horizontal reference tracks 336. In some embodiments, relative to the height of CMD patterns 352 for first reference voltage (Vr) applications, the height of CMD patterns 352 is increased for high voltage (Vh) applications to satisfy design rules. In some embodiments, the height of CMD patterns 352 is increased from slightly greater than 2 d for first reference voltage (Vr) applications (FIG. 3D) to be equal to or greater than 7 d to satisfy design rules in high voltage (Vh) applications, where d is the size of a corresponding fundamental structure which is manufacturable by a corresponding semiconductor process technology node. In some embodiments, d represents a minimal distance between corresponding points of a first instance of a fundamental structure and a nearest second instance of the fundamental structure, such structures being manufacturable by a corresponding semiconductor process technology node. In some embodiments, d≈0.14 nanometers (nm). In some embodiments, GRV cell regions 216 have a height of 18.6 d; however, as shown in Table 1 below, other cell heights, transistor channel lengths (Transistor Lg), spacings in terms of contact poly pitch (CPP) (e.g., distance between neighboring centers of gate electrodes), numbers of fins (N_Fin) (e.g., ARs), numbers of tracks (such as tracks 328 and 336), values of voltage applied to GR cell regions, or the like, are within the contemplated scope of the present disclosure.

TABLE 1

Dimensions of Various Embodiments

| | Core Cells | | | | | | Input/Output (I/O) Cells | | |
|---|---|---|---|---|---|---|---|---|---|
| Cell Height | 9.3 d | 14.9 d | 18.6 d | | | | 20 d | 20 d | 24 d |
| Transistor Lg | 0.2 d | 0.2 d | 0.2 d | 0.2 d | 3.9 d | 3.9 d | 3.9 d | 6.1 d (1.3Vr & 1.6Vr) | 6.1 d (1.3Vr & 1.6Vr) |
| CPP | 3.2 d | 3.2 d | 3.2 d | 3.2 d | 9.6 d | 9.6 d | 9.6 d | 11.9 d | 11.9 d |
| N_Fin | 2 | 4 | 2 × 2 | 6 | 2 × 2 | 6 | 6 | 6 | 8 |
| Tracks | 3 T/4 T | 6 T | 6 T/8 T | 6 T/8 T | 6 T | | 3 T | 3 T | 3 T |
| HV GR | Vr0.9 | Vr0.9 | Vr0.9 | Vr0.9 | n/a | | n/a | Vr0.9 | Vr0.9 |

For a given IC structure manufactured according to a given semiconductor process technology node, regardless of whether gate structures in the given integrated circuit (IC) are formed of polysilicon, some embodiments refer a minimal distance between corresponding points of a first gate structure and a nearest second gate structure as contacted poly pitch (CPP) for the reason of historical convenience, i.e., because gate structures in ICs manufactured according to one or more predecessor semiconductor process technology nodes were formed of polysilicon. The size of CPP varies according to the corresponding semiconductor process technology node.

FIG. 3B is a layout diagram 302B representing a few levels of the same corresponding semiconductor device represented by layout diagram 302A of FIG. 3A, wherein some of the levels represented in FIG. 3B are different than the levels represented by layout diagram 302A of FIG. 3A. In particular, layout diagram 302B represents structures included in a fourth level 342 (FIG. 3E). FIG. 3B includes CMD patterns 352 that are also shown in FIG. 3A so as to help relate/register FIGS. 3A-3B with respect to the other.

In FIG. 3B, M_1st patterns 356 are included in a first layer of metallization. In some embodiments, M_1st patterns 356 represent electrically conductive segments of a first metallization layer in fourth level 342 (FIG. 3E). M_1st patterns 356 are above MD patterns 346 (FIG. 3A), the latter being above AR patterns 364 and 364A (FIG. 3C). In FIG. 3B, the metallization numbering scheme begins with zero, so the first metallization level is M0. In some embodiments that use a metallization numbering scheme which begins with one, the first metallization level is M1. M_1st patterns 356 extend in the direction of the X-axis.

In some embodiments, there is an interconnect level, e.g., third level 3964 (FIG. 3E) in between second level 394 and fourth level 342. In such embodiments, the third level includes via-to-source/drain (VD) patterns 368 (FIGS. 3C-3D) that interconnect an MD pattern 346 with a corresponding M_1st pattern 356 and via-to-gate (VG) patterns 369 (FIGS. and 3D) that interconnect a gate electrode 372 with a corresponding M_1st pattern 356.

As noted above, embodiments of the present disclosure use first and second minimum horizontal gaps having corresponding first and second sizes. Nearest abutted first (e.g., 356B_1 FIG. 3D) and second (e.g., 356B_2 FIG. 3D) instances of M_1st pattern 356 that are electrically connected to corresponding voltage values having a difference equal to or less than a standard voltage, e.g., a first reference value (Vr), are separated by the first minimum horizontal gap (348 FIG. 3D) having the first size (G1). In FIG. 3D, G1≈1*d, where d is as defined above. An example of the second minimum horizontal gap is gap 349 of FIG. 3B. The second size (G2) of the second horizontal gap, i.e., the size of horizontal gap 349, ensures the minimum degree of electrical isolation between a third instance of an M_1st pattern 356 (e.g., in a vertical analog GR section 316) and a nearest abutted fourth instance of M_1st pattern 356 (e.g., in an analog ACT section 322) under circumstances in which a difference between voltage values levels correspondingly on the third and fourth M_1st segments is equal to or less than the third reference value (Vh). In some embodiments, G2≈8*G1. In some embodiments, G2≈8.1*G1. In some embodiments, G1≈14 nanometers (nm) and G2≈113 nm. FIG. 3B also includes horizontal analog GR sections 314.

Instead of turning the discussion to FIG. 3C, instead the discussion will turn to FIG. 3D, and then FIG. 3E. After the discussion of FIG. 3E, the discussion will turn to FIG. 3C.

FIG. 3D is a layout diagram 302D of a semiconductor device, in accordance with some embodiments.

In FIG. 3D, one instance of M_1st segment 356 has first and second portions labeled correspondingly as first 356B_1 and second 356B_2 M_1st segments that have co-track (or substantially collinear) long axes extending in the direction of the X-axis. First 356B_1 and second 356B_2 M_1st segments reflect the effect of a corresponding instance of cut-M0-A (CM0A) pattern 360A or a corresponding instance of cut-M0-B (CM0B) pattern 360B. Relative to the X-axis, each of CM0A pattern 360A and CM0B pattern 360B has the first size (G1) representing the first minimum horizontal gap. In FIG. 3D, G1 is d (defined above).

For example, in a circumstance in which each of M_1st segments 356B_1 and 356B_2 is in the same GR cell, first M_1st segment 356B_1 and second M_1st segment 356B_2 are designated for electrical connection to corresponding voltage values having a difference equal to or less than a standard voltage, e.g., a first reference value (Vr).

For example, in a circumstance in which M_1st segment 356B_1 is in a GR cell and M_1st segment 356B_2 is in an analog ACT cell, M_1st segments 356B_1 and 356B_2 are designated for electrical connection to corresponding voltage values having a difference equal to or less than a standard voltage, e.g., a first reference value (Vr) because each of the GR cell and the analog ACT cell is operated according to the standard voltage, e.g., first reference value (Vr).

The first size of the first horizontal gap ensures a minimum degree of electrical isolation between M_1st segments 356B_1 and 356B_2 under circumstances in which a difference between voltage values levels correspondingly on the first and second M_1st segments is equal to or less than the first reference value (Vr).

In FIG. 3D, relative to the Y-axis, the following is noted: CMD patterns have a height of less than or equal to about 2 d; instances of M_1st segment 356 (including M_1st segments 356B_1 and 356B_2) have a height of about 2 d; M_1st segments 356 (including 356B_1 and 356_B2) have a height of about 2 d; some instances of M_1st segments 356 are separated from each other by a distance of about 0.7 d; and some instances of M_1st segments 356 are separated from each other by a distance of about 1.3 d. In some embodiments, relative to the Y-axis, a design rule establishes 0.7 d as is the minimum width of each M_1st segment 356. In some embodiments, relative to the Y-axis, a first given design rule establishes 0.7 d as the minimum separation of M_1st segments 356 that are designated for electrical connection to corresponding voltage values having a difference equal to or less than the standard voltage, e.g., a first reference value (Vr). In some embodiments, relative to the Y-axis, upon satisfying the first given design rule, a uniform larger spacing between such M_1st segments 356 is used depending upon a height (also relative to the Y-axis) of the corresponding cell. In some embodiments, within a given cell, a second given design rule establishes 1.1 d as the minimum separation of M_1st segments 356 that are designated for electrical connection to corresponding voltage values having a difference equal to or less than a high voltage, e.g., the third reference value (Vh). In some embodiments, within a given cell and relative to the Y-axis, upon satisfying the second given design rule, a uniform larger spacing between such M_1st segments 356 is used depending upon a height (also relative to the Y-axis) of the corresponding cell, e.g., a spacing of 1.3 d.

FIG. 3E is a cross sectional diagram 302E of a semiconductor device corresponding to layout diagram 302C along section line 3E-3E' in FIG. 3C, in accordance with some embodiments.

In FIG. 3E, cross-section 302E includes a first level 390, a second level 394 on first level 390, a third level 396 on second level 394, and a fourth level 342 on third level 396. Alternatively, first level 390 is referred to as substrate level 390. Alternatively, second level 394 is referred to as MD/gate level 394. Alternatively, third level 396 is referred to as via-to-drain/source (VD) and via-to-gate (VG) level 396. Alternatively, fourth level 342 is referred to as M_1st level 342.

First level 390 includes a substrate 344 and active regions 364A and 364B formed on substrate 344. Active regions 364A-364B are included in an AR level 392, which is a sub-level of first level 390. In electronics, a substrate is a slice or wafer of semiconductor material, e.g., crystalline silicon (c-Si), or the like, used for the fabrication of ICs, such as ICs 100, 200 and 100. A wafer serves as the substrate for microelectronic devices built in and upon the wafer. The wafer undergoes many microfabrication processes, such as doping, ion implantation, etching, thin-film deposition of various materials, and photolithographic patterning. Finally, the individual microcircuits are separated by wafer dicing and packaged as an IC, such as ICs 100, 200, or the like.

Turning the discussion to FIG. 3C, FIG. 3C corresponds to a portion 3C of FIG. 3B. In FIG. 3C, layout diagram 302C includes a GRV cell region 316i and a portion of an analog CPDd cell region 319d. GRV cell region 316i is an example of the various types of GRV cell region 216e, 216f, and 216i found in columns C1 to C3 of FIG. 2. Analog CPDd cell region 319d is an example of the various types of analog CPDd region 219d, 219i, 222 found in columns C4 to C6 of FIG. 2.

In FIG. 3C, layout diagram 302C includes M_1st patterns 356, particular examples of which are M_1st patterns 356A_1 and 356A_2, that are configured to be electrically conductive.

In FIG. 3C, layout diagram 302 further includes AR patterns 364 and 364A in substrate shape 344. AR pattern 364 and AR pattern 364A include corresponding long axes that extend in the X axis and are substantially collinear. AR pattern 364 and AR pattern 364A are free from another instance of AR pattern being between the AR pattern 364 and AR pattern 364A. In some embodiments, AR pattern 364 and 364A are combinations of two or more fin patterns (e.g., AR patterns). For example, with reference to Table 1, AR patterns 364 and 364A are a combination of six fin patterns. In another example, AR patterns 364 and 364A are a combination of fin patterns in a 2×2 matrix. Other suitable fin pattern structures are within the contemplated scope of the present disclosure.

Layout diagram 302 further includes via-to-drain/source (VD) patterns 368 that are configured to electrically corresponding MD patterns 346 (FIG. 3A) with corresponding instances of M_1st patterns 356. In some embodiments, for a high voltage (Vh) application, an instance of VD pattern 368 is removed so as not to overlie an end of an instance of M_1st segment 356, e.g., because a VD pattern adds an increased amount of conductive material that will cause the circuit to fail design rules during DRC.

Layout diagram 302C further includes gate electrodes 372 and isolation dummy gates 373. Electrically active gate electrodes 372 are correspondingly over interior portions of AR patterns 364 and 364A. Isolation dummy gates 373 are over corresponding ends of corresponding AR patterns 364 and 364A. In some embodiments, dummy gate electrodes (e.g., 375 FIG. 3E, 475 FIGS. 4A-), i.e., electrically inactive gate electrodes, are used in place of isolation dummy gates 373.

As noted above, between corresponding M_1st segments, embodiments of the present disclosure use first and second minimum horizontal gaps having corresponding first and second sizes. An example of the second minimum horizontal gap is horizontal gap 349 of FIG. 3C. The second size (G2) of the second horizontal gap, i.e., the size of horizontal gap 349, ensures the minimum degree of electrical isolation between a third instance of an M_1st pattern 356 (e.g., 356A_1 FIG. 2) and a nearest abutted fourth instance of M_1st pattern 356 (e.g., 356A_2 FIG. 2) under circumstances in which a difference between voltage values levels correspondingly on the third and fourth M_1st segments is equal to or less than the third reference value (Vh). In FIG. 3C, M_1st segments 356A_1 and 356A_2 are not co-track (or substantially collinearly) aligned. However, relative to the Y-axis in FIG. 3C, M_1st segments 356A_1 and 356A_2 overlap each other, and hence are regarded as being abutted. In some embodiments, G2≈8*G1. In some embodiments, G2≈8.1*G1. In some embodiments, G2≈8.6*G1. In some embodiments, G1≈14 nanometers (nm) and G2≈120 nm. FIG. 3B also includes horizontal analog GR sections 314.

As noted above, between corresponding M_1st segments, embodiments of the present disclosure use third and fourth minimum vertical gaps having corresponding third and fourth sizes. An example of the first vertical gap having the third size is the vertical gap in FIG. 3C having a size of about 1.0 d which is found between some nearest stacked instances M_1st segments 356. An example of the second vertical gap having the fourth size is the vertical gap in FIG. 3C having a size of about 1.1 d which is found between some nearest stacked instances M_1st segments 356.

In FIG. 3C, relative to the Y-axis, the following is noted: some instances of CMD patterns have a height of about 7.1 d; some instances of M_1st segment 356, e.g., instances of M_1st segment 356 in GRV cell region 316i designated for a high voltage value such as third reference value (Vh), instances of M_1st segment 356 in analog CPDd cell region 319d, or the like, have a height of about 2.0 d; some instances of M_1st segment 356, e.g., instances of M_1st segment 356 in GRV cell region 316i not designated for a high voltage value such as third reference value (Vh), or the like, have a height of about 1.7 d; in GRV cell region 316i, nearest stacked M_1st segments coupled to the same voltage value are separated by a gap of about 1.0 d; in GRV cell region 316i, nearest stacked M_1st segments for which a difference between voltage values levels on the nearest stacked M_1st segments is equal to about the third reference value (Vh) are separated by a gap of about 1.1 d; instances of M_1st segment 356 nearest a top boundary or bottom boundary of the corresponding cell region are separated from the corresponding top boundary or bottom boundary by a gap of about ½(2.1 d) such that nearest stacked instances of M_1st segment 356 correspondingly in nearest stacked cell regions have a gap of about 2*(½(2.1 d)), i.e., about 2.1 d; and some instances of M_1st segment 356, e.g., instances of M_1st segment 356 designated for a high voltage value such as third reference value (Vh) have a height of about 2 d.

In FIG. 3C, relative to the X-axis, the following is noted: an instance of isolation dummy gate 373 in GRV cell region 316i is separated from a nearest end of a nearest abutting instance of M_1st segment 356 in analog CPDd cell region 319d by a gap of about 8 d; an instance of isolation dummy gate 373 in analog CPDd cell region 319d is separated from a nearest end of a nearest abutting instance of M_1st segment 356 in GRV cell region 316i by a gap of about 11 d; instances of M_1st segment 356 in analog CPDd cell region 319d extend beyond a left edge of AR pattern 364A towards GRV cell region 316i by a distance of about 1.5 d; and left-most ends of instances of M_1st segment 356 in analog CPDd cell region 319d are separated from a left boundary of analog CPDd cell region 319d by a distance of about 3.2 d.

In some embodiments, instances of M_1st segment 356 in analog CPDd cell region 319d extend beyond a left edge of AR pattern 364A towards GRV cell region 316i by a distance of about 1.7 d. In some embodiments, left-most ends of instances of M_1st segment 356 in analog CPDd cell region 319d are separated from a left boundary of analog CPDd cell region 319d by a distance of about 3.4 d.

In some embodiments, vertical GR cell regions, e.g., GRV cell region 316i, include two fingers (e.g., two electrically active gates) (FIG. 4A). In some embodiments, GRC cell regions include two fingers (e.g., two electrically active gates) (FIG. 4A).

In some embodiments, additional options are added to EDA software to support both GR regions and analog CPDd/ACT cell regions configured for standard voltage values equal to first reference value (Vr) and for high voltage values equal to third reference value (Vh). In some embodiments, a PDK option for 'a CMD (cut metal diffusion) for high voltage application' option is added to EDA software that allows a user to select taller (relative to the Y-axis) CMD pattern so that the corresponding circuit passes a type of design rule referred to as a high voltage MD δ-V rule. The high voltage MD δ-V rule specifies a distance between MD segments based upon the difference in voltage at each of the MD segments. In some embodiments, an 'M0 for high voltage application' option is added to EDA software that allows a user to choose the second horizontal gap rather than the first horizontal gap between nearest abutting M_1st segments in order to satisfy a type of design rule referred to as high voltage M_1st δ-V rule, e.g., in a context of an analog GR cell abutting an analog cell. The high voltage M_1st δ-V rule specifies use of the first horizontal gap or the second horizontal gap based upon the difference in voltage between corresponding nearest abutted M_1st segments.

In some embodiments, a component description format (CDF) option in an EDA is configured to allow a user to add and/or change the property of a component. In some embodiments, the user is able to customize a system requirement. In some embodiments, the 'M_1st for high voltage application' option is a CDF option. In some embodiments, the 'CMD for high voltage application' option is a CDF option. In some embodiments, instead of having the 'CMD for high voltage application' option is a CDF option, the taller (relative to the Y-axis) CMD pattern is used for both high voltage (Vh) and reference voltage (Vr) applications.

FIG. 4A is a layout diagram of a semiconductor device 402, in accordance with some embodiments.

In FIG. 4A, the semiconductor device corresponding to layout diagram 402 is an example of semiconductor device 202 or 102. Layout diagram 402 is an example layout diagram 302C of FIG. 3C.

Layout diagram 402 includes AR patterns 464 and 464A. AR pattern 464 is located in a GRV cell 416i, the latter being an example of the various types of GRV cell regions 216i found in column C3 of FIG. 2. AR pattern 464A is located in a GRC cell region 414i, the latter being an example of GRCi (R0) cell region 214i(R0) at the intersection of row R1 and column C3 of FIG. 2.

In FIG. 4A, ARs 464 and 464A include corresponding long axes that extend in the X-axis. ARs 464 and 464A are free from another instance of AR being between ARs 464 and 464A such that ARs 464 and 464A are separated by a gap. Layout diagram 402 also includes M_1st segments 456 which are designated to be electrically conductive. M_1st segments 456 extend in the first direction. In some embodiments, M_1st segments 456 are free from another instance of M_1st segment being between M_1st segments 456 and other M_1st segments such that the M_1st segments 456 are separated by gap 349 before another instance of M_1st segments. In some embodiments, M_1st segments 456 correspond to AR 464.

In FIG. 4A, M_1st segments 456 are correspondingly above AR patterns 464 and 464A. Relative to the Y-axis, corresponding M_1st segments 456 are separated from each other.

Layout diagram 402 includes gate electrodes 472 which are be electrically conductive and dummy gate electrodes 475 which are not electrically active. Gate electrodes 472 and one instance of dummy gate electrode 475 overlie corresponding M_1st segments 456. Gate electrodes 472 and dummy gate electrodes 475 have corresponding long axes extending in the Y-axis substantially perpendicular to the X-axis and are separated from each other relative to the X-axis. Instances of gate electrode 472 are over corresponding AR patterns 464 and 464A, i.e., there are two instances of gate electrode 472 in layout diagram 402. Instances of dummy gate electrode 475 are not over corresponding AR patterns 464 and 464A, i.e., there are three instances of dummy gate electrode 475 in layout diagram 402. In some embodiments, each of GRCi cell region 414i and GRVi cell region 416i is referred to as having two fingers, where a finger refers to an instance of gate electrode 472.

Gate-cut (CPO) patterns 474 indicate that any corresponding portions of gates 472 lying underneath CPO patterns 474 are cut, removed or both. In some embodiments, CPO is an acronym of historical convenience referring to cut poly, where poly refers to polysilicon; gate structures in ICs manufactured according to one or more predecessor semiconductor process technology nodes were formed of polysilicon.

Relative to the Y-axis, a given instance of CPO 474 electrically isolates upper and lower portions of a gate electrode 472 which lies under the given instance of CPO pattern 474. Relative to the Y-axis, in some embodiments, CPO pattern 474 has a height of about 2 d.

Layout diagram 402 further includes isolation dummy gates 473. Isolation dummy gates 473 are over corresponding ends of corresponding AR patterns 464 and 464A. In some embodiments, dummy gate electrodes (e.g., 375 FIG. 3E, 475 FIGS. 4A-4B & 4D) are used in place of isolation dummy gates 473.

In some embodiments, AR pattern 464A represents one fin. In FIG. 4A, AR pattern 464A is the same width as AR pattern 464 relative to the X-axis, however, AR pattern 464A is approximately a quarter of the height of AR pattern 464 relative to the Y-axis. In some embodiments, AR pattern 464 represents multiple fins (e.g., six fins) while AR pattern 464A represents one fin. In some embodiments, the reduced number of fins for AR pattern 464A facilitates GRC cell region 414 being in the corner of a guard ring. In some embodiments, the multiple fins represented by AR pattern 464 facilitate stacking instances of GRV cell region 416i on each other.

FIG. 4A assumes that a high voltage (Vh) analog ACT cell region is to be disposed to the right of GRVi cell region 416i such that the widths (with respect to the X-axis) of M_1st segments 456 are reduced resulting in gap 349, the latter having the size of the second horizontal gap. In some embodiments, ends 470 of M_1st segments 456 are free from VD patterns 468 which reduces the surface area of MD structures closest to M_1st segments in a nearest abutted ACT cell region, thus satisfying, e.g., the M_1st δ-V design rule.

In FIG. 4A, MD patterns 446 overlie AR 464 and underlie M_1st segments 456. MD patterns 446 are separated from MD patterns 446A by CMD pattern 452 that creates gap 444 relative to the Y-axis. In some embodiments, gap 447 in FIG. 4A is 7.1 d. As discussed below in more detail, an IC designer is able to select a CMD of a high voltage application in a PDK user interface. In some embodiments, the increased height of CMD 452 provides electrical isolation between MD patterns 446 and 446A at higher voltages.

FIGS. 4B, 4C, 4D, 4E and 4F are layout diagrams of corresponding cell regions, in accordance with some embodiments.

Figure 4B:
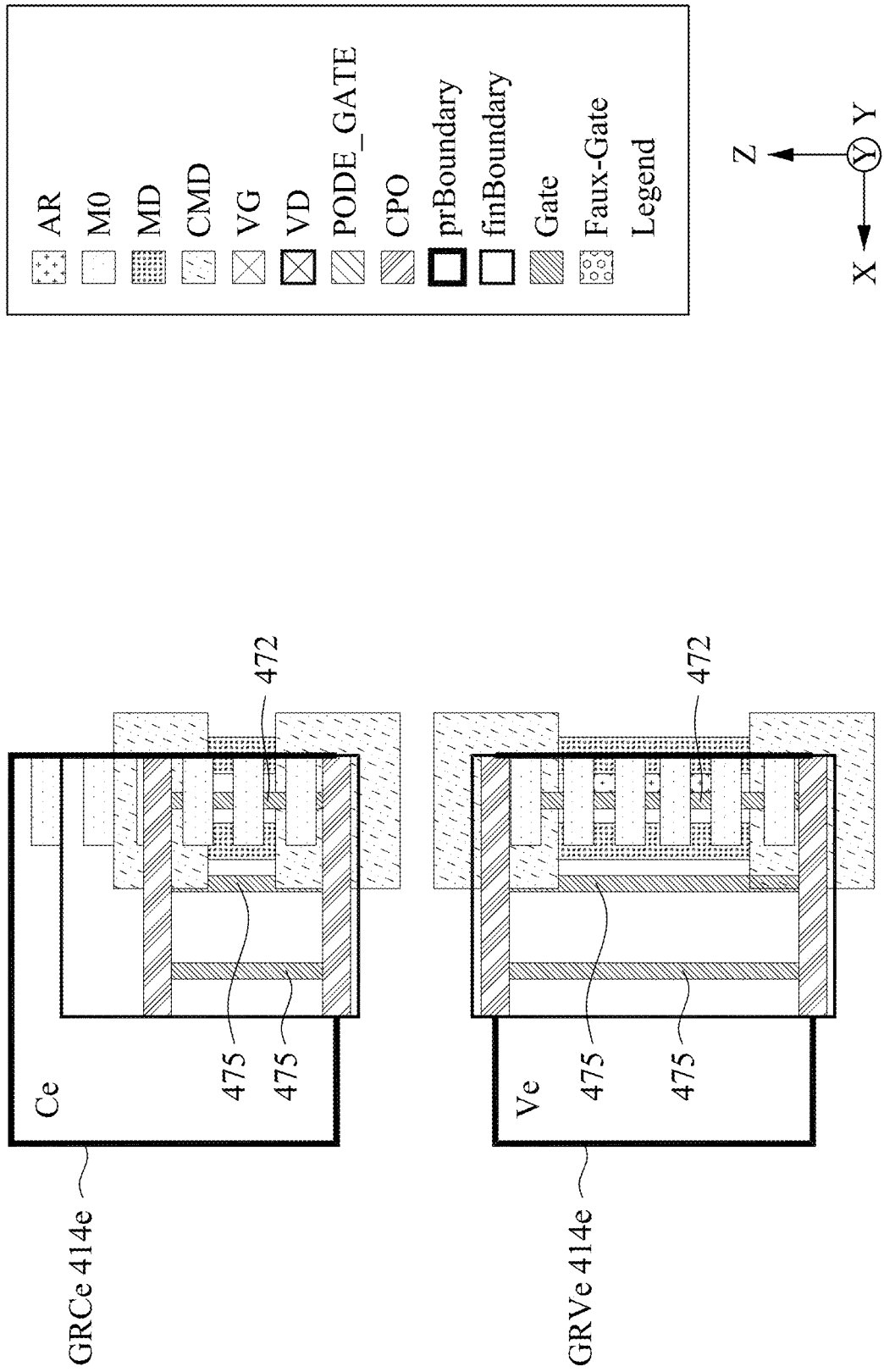

More particularly, FIG. 4B is a layout diagram of a GRCe cell region 414e and a GRVe cell region 416e. GRCe cell region 414e is an example of the various types of GRCe cell region 214e found in column C1 of FIG. 2. GRVe cell region 416e is an example of the various types of GRVe cell region 216e found in column C1 of FIG. 2.

In FIG. 4B, each of GRCe cell region 414e and GRVe cell region 416e includes a single gate electrode 472. In some embodiments, each of GRCe cell region 414e and GRVe cell region 416e is referred to as having one finger.

Figure 4C:
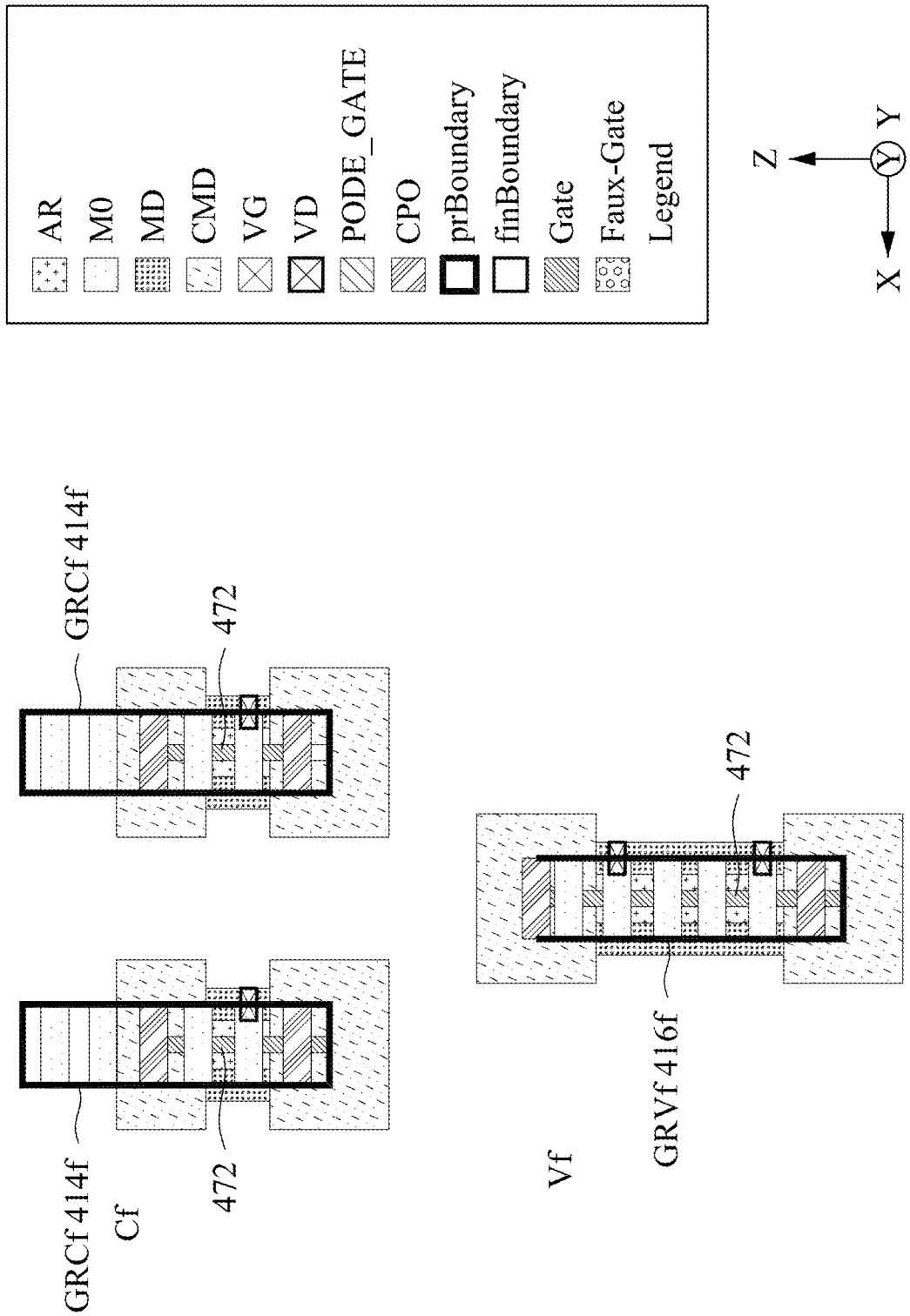

FIG. 4C is a layout diagram of GRCf cell regions 414f and a GRVf cell region 416f. GRCf cell region 414f is an example of the various types of GRCf cell region 214f found in column C2 of FIG. 2. GRVf cell region 416f is an example of the various types of GRVf cell region 216f found in column C2 of FIG. 2.

In FIG. 4C, each of GRCf cell regions 414f and GRVf cell region 416f includes a single gate electrode 472. In some embodiments, each of GRCf cell regions 414f and GRVf cell region 416f is referred to as having one finger.

Figure 4D:
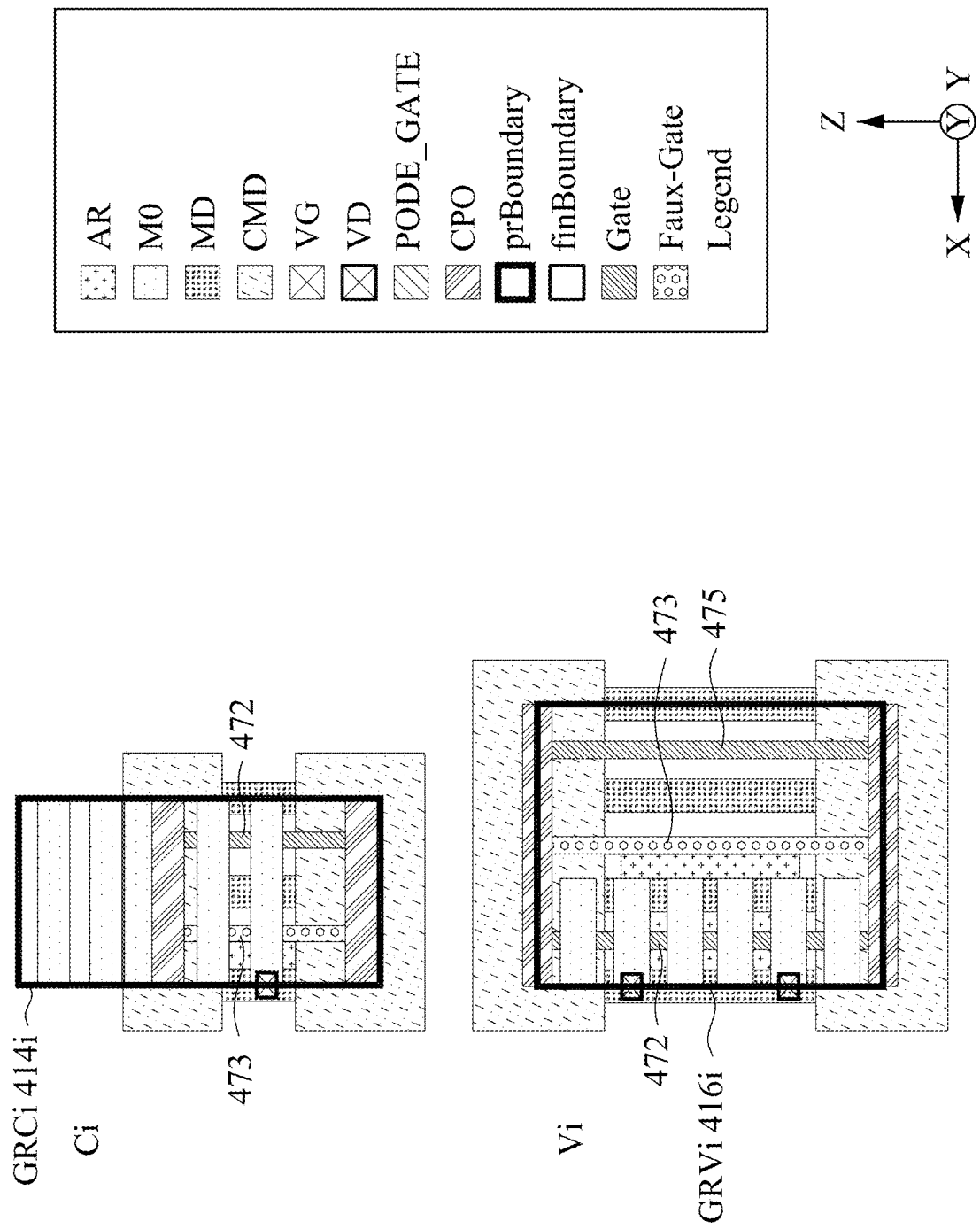

FIG. 4D is a layout diagram of a GRCi cell region 414i and a GRVi cell region GRVi 416i. GRCi cell region 414i is an example of the various types of GRCi cell region 214i found in column C3 of FIG. 2. GRVi cell region 416i is an example of the various types of GRVi cell region 216i found in column C3 of FIG. 2.

In FIG. 4D, each of GRCi cell region 414i and GRVi cell region 416i includes a single gate electrode 472. In some embodiments, each of GRCi cell region 414i and GRVi cell region 416i is referred to as having one finger.

Figures 4E, 4F:
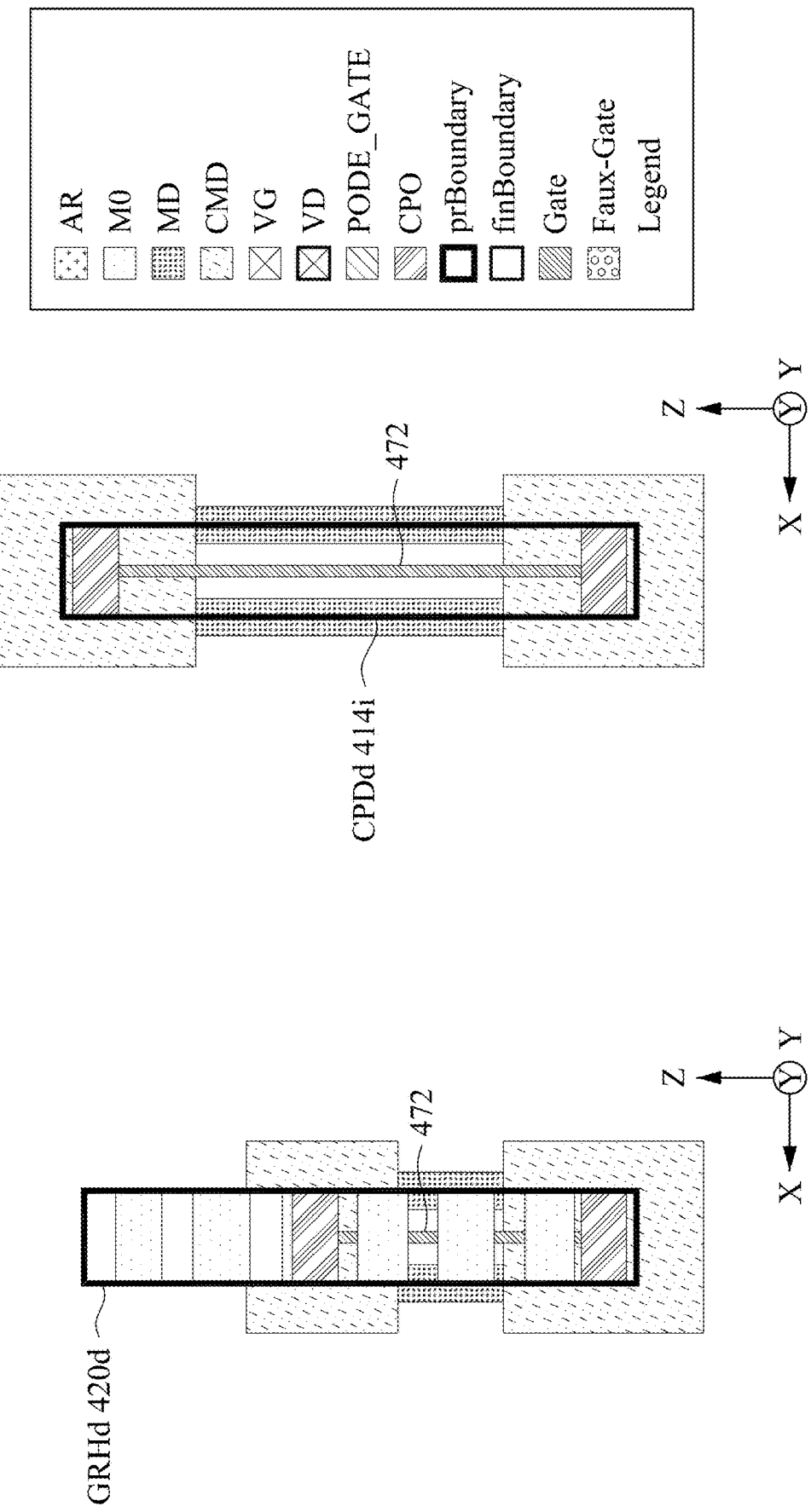

FIG. 4E is a layout diagram of a GRH cell region 414i, which is an example of the various types of GRH cell region at the intersections of row RW1 & columns C4-C8 and row RW10 & columns C4-C8.

FIG. 4F is a layout diagram of a GRH cell region 414i, which is an example of the various types of GRH cell region at the intersections of row RW1 & columns C4-C8 and row RW10 & columns C4-C8.

Figure 5A:
FIGS. 5A-5B are corresponding block diagram views of a process design kit (PDK) user interface, in accordance with some embodiments.
Figure 5B:
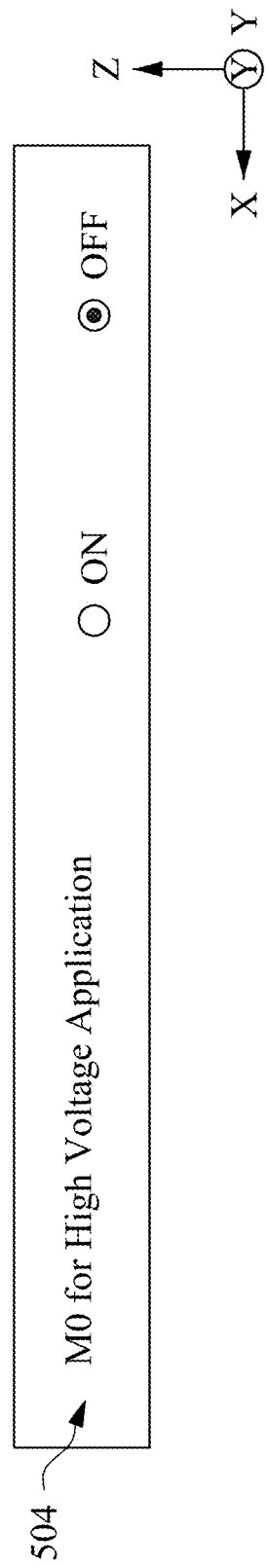

FIGS. 5A-5B are block diagram views of corresponding process design kit (PDK) user interfaces 500, in accordance with some embodiments.

In some embodiments, selection options provided by PDK user interfaces 500A and 500B are used for an IC developer to choose between (A) a high voltage (Vh) analog GR cell region and a high voltage (Vh) analog ACT cell region and (B) a standard voltage (Vr) analog GR cell region and a standard voltage (Vr) analog ACT cell region. In some embodiments, high voltage (Vh) options 502 of FIG. 5A and 504 of FIG. 5B are supported in EDA for analog ACT cell regions and corresponding analog GR cell regions.

In FIG. 5A, a user, such as an IC developer, is able to select "CMD for high voltage application" option 502 which implements a taller (relative to the Y-axis) CMD pattern to satisfy a high voltage (Vh) MD δV rule in DRC. FIG. 5A assumes that option 502 has not yet been selected.

In FIG. 5B, a user, such as an IC developer, is able to select "M0 for high voltage application" option 504 which implements the second horizontal gap between nearest abutting M_1st segments in order to satisfy a high voltage (Vh) M0 δV rule in DRC. FIG. 5B assumes that option 504 has not yet been selected.

FIGS. 6A and 6B are corresponding layout diagrams 602A and 602B of corresponding semiconductor devices, in accordance with some embodiments.

More particularly, FIGS. 6A and 6B reflect the results of option 502 of FIG. 5A being correspondingly off or on. Relative to the Y-axis, instances of CMD pattern 652A in FIG. 6A are shorter than corresponding instances of CMD pattern 652B in FIG. 6B.

Cell region boundaries 680A and 680B remain the same and ARs 664A and 664B remain the same irrespective of whether the CMD pattern is shorter or taller. Thus, transition from a standard voltage (Vr) application and the associated shorter CMD pattern to a high voltage (Vh) application and the associated taller CMD pattern does not cause the corresponding cell region to consume additional space in the layout diagram.

Figures 7A, 7B:
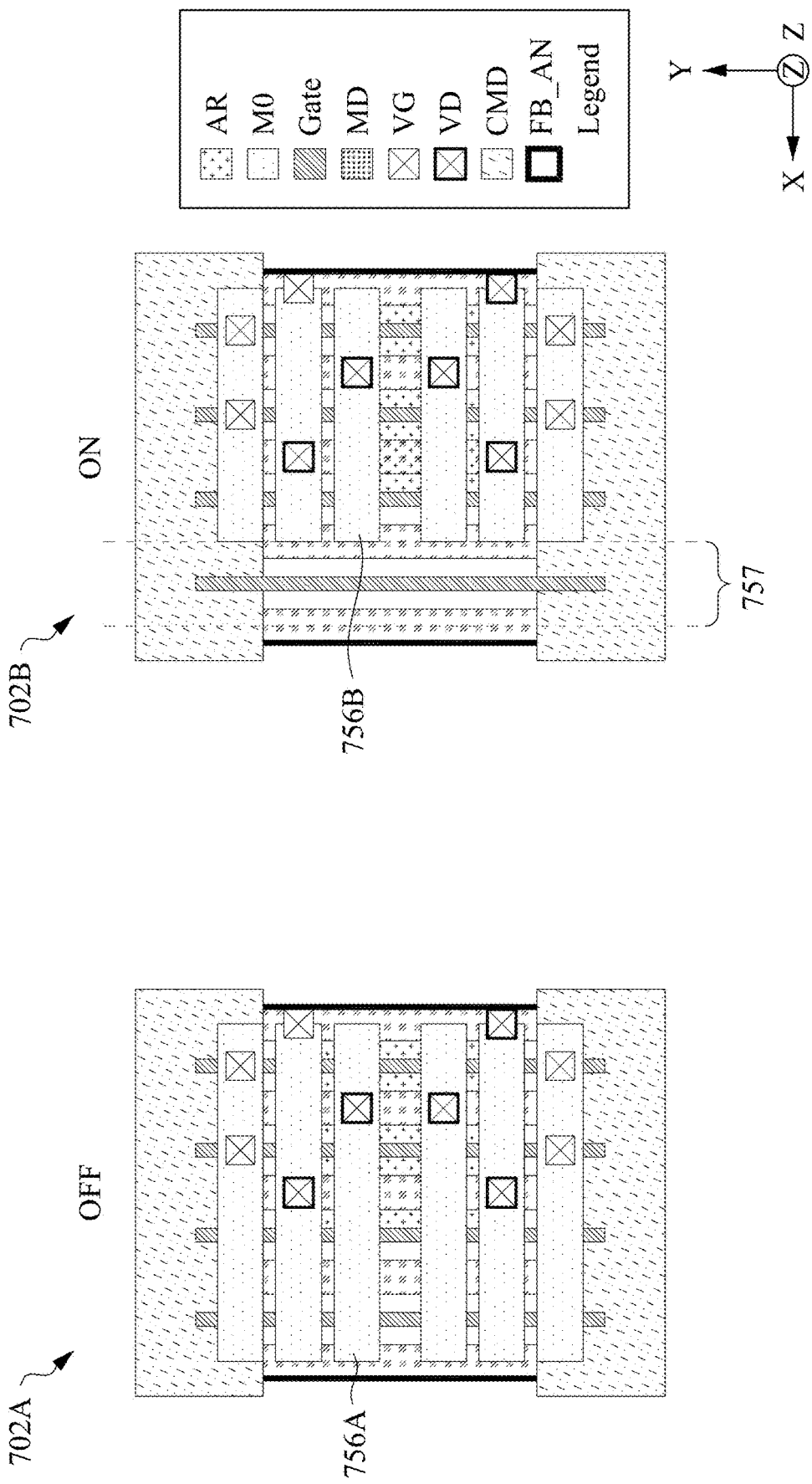
FIGS. 7A and 7B are corresponding layout diagrams of a semiconductor device, in accordance with some embodiments.

FIGS. 7A and 7B are corresponding layout diagrams 702A and 702B of corresponding semiconductor devices, in accordance with some embodiments.

More particularly, FIGS. 7A and 7B reflect the results of option 504 of FIG. 5B being correspondingly off or on. Relative to the X-axis, instances of M_1st segments 756A in FIG. 7A are wider than corresponding instances of M_1st segments 756B in FIG. 7B. The narrower width of instances of M_1st segments 756B in FIG. 7B leaves a gap 757 in FIG. 7B as compared to FIG. 7A. As compared to the cell region boundary and the width of the AR pattern in FIG. 7A, the cell region boundary and the width of the AR pattern in FIG. 7B do not change size due to the reduced width of M_1st segments 756B. Thus, transition from a standard voltage (Vr) application and the associated wider M_1st segments to a high voltage (Vh) application and the associated narrower M_1st segments does not cause the corresponding cell region to consume additional space in the layout diagram.

User interface options for high voltage (Vh) for various embodiments are summarized below in Table 2. Rows 1-4 of Table 2 relate to both analog ACT cell regions and analog GR cell regions. Rows 5-6 of Table 2 relate to analog ACT cell regions. Row 7 of Table 2 relates to analog GR cell regions.

TABLE 2

User interface options for High Voltage (Vh) of Various Embodiments

| Row | CDF Options | Core | | | | | | IO | |
|---|---|---|---|---|---|---|---|---|---|
| 1 | Cell Height | 9.3 d | 14.9 d | 18.6 d | | | | 20 d | 24 d |
| 2 | Transistor Lg | 0.2 d | 0.2 d | 0.2 d | | | 0.2 d | 6.1 d (1.3Vr & 1.6Vr) | 6.1 d (1.3Vr & 1.6Vr) |
| 3 | N_Fin | 2 | 4 | 2 × 2 | | 6 | | 6 | 8 |
| 4 | Tracks | 3 T 4 T | 6 T | 6 T | 8 T | 6 T | 8 T | 3 T | 3 T |
| 5 | CMD for Vh application | ON ON | OFF | ON | OFF | ON | OFF | OFF | OFF |
| 6 | M0 for Vh ACT cell region abutting GR cell region | ON ON | ON | ON | ON | ON | ON | OFF | OFF |
| 7 | GR cell Vh | ON ON | ON | ON | ON | ON | ON | ON | ON |

Figure 8A:
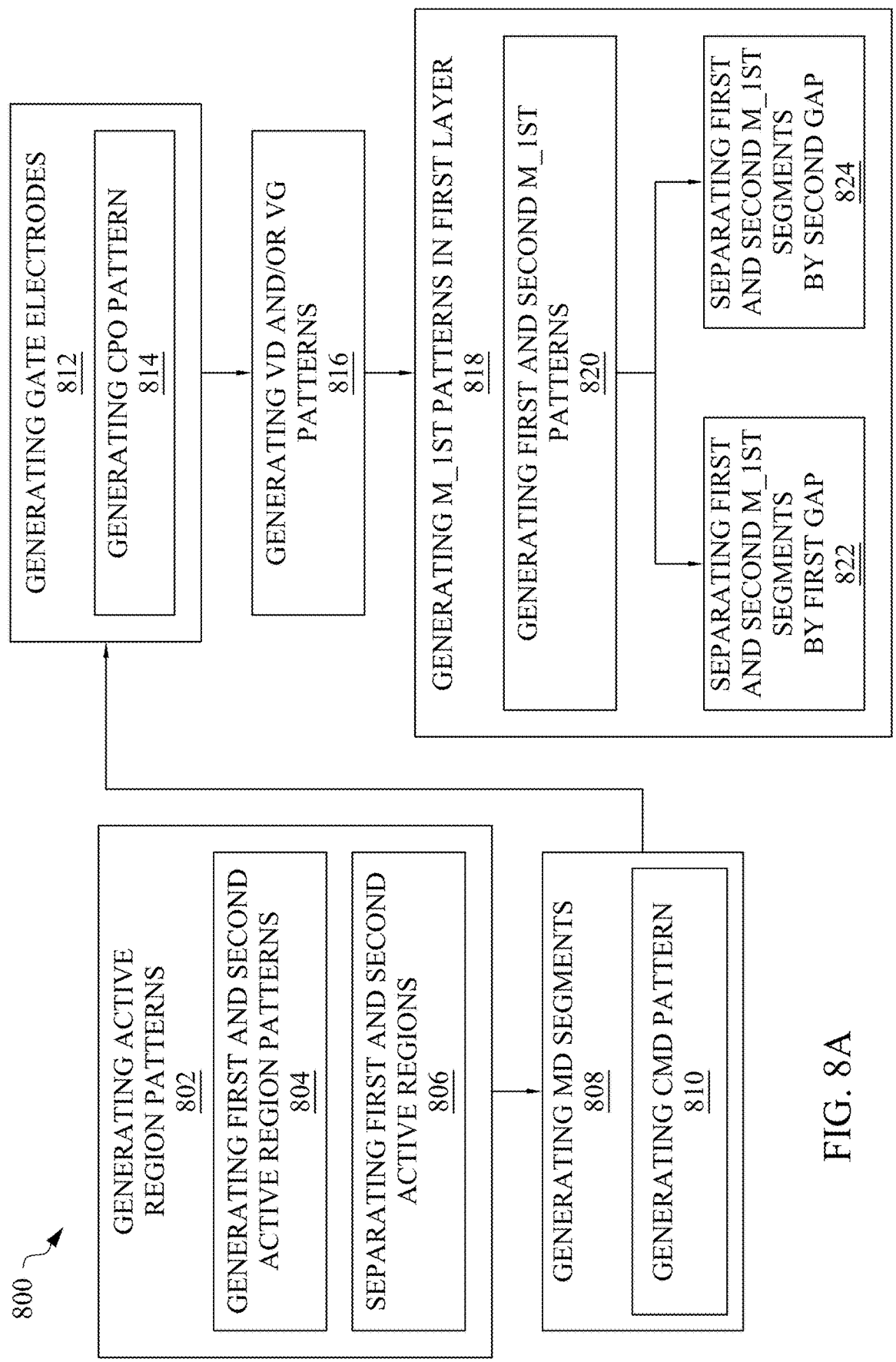
FIG. 8A is a flowchart of a method of generating a layout diagram, in accordance with some embodiments.

FIG. 8A is a flowchart 800 of a method of generating a layout diagram, in accordance with some embodiments.

In FIG. 8A, flowchart 800 includes blocks 802-824. At a block 802, active region patterns are generated that extend in a first direction, e.g., parallel to the X-axis. Examples of active region patterns include AR patterns 364, 364A, 464 and 464A of corresponding FIGS. 3C and 4A, or the like. Block 802 includes blocks 804-806. From block 802, flow proceeds to block 804.

At block 804, first and second active region patterns are generated as specific instances of the active region patterns generated at block 802. Examples of such first AR patterns include AR patterns 364 and 464 of corresponding FIGS. 3C and 4, or the like. An example of the second AR pattern is AR pattern 364A in FIG. 3C, or the like. From block 804, flow proceeds to block 806.

At block 806, first and second active regions are separated by a gap. Examples of such first and second active regions being separated by a gap include active region patterns 364 and 364A separated by a gap 355 of FIG. 3C, or the like. From block 806, flow proceeds to a block 808.

At block 1608, MD segments are generated. The MD patterns are arranged substantially parallel to each other and extend in a second direction, e.g., parallel to the Y-axis, the second direction being perpendicular to the first direction. The MD patterns are overlaid correspondingly on the active region patterns. Examples of such MD patterns are instances of MD patterns 346 of FIG. 3A, 446 of FIG. 4A, or the like. Block 808 includes block 810. From block 808, flow proceeds to a block 810.

At block 810, CMD patterns are generated. Examples of such CMD patterns include CMD patterns 352 of FIGS. 3A and 3B, 452 of FIG. 4A, 652A of FIG. 6A, 652B of FIG. 6B, or the like. From block 810, flow proceeds to a block 812.

At block 812, gate electrodes are generated over corresponding active regions. Examples of gate electrodes are gate electrodes 372 in FIGS. 3C and 3E, 472 in FIGS. 4A-4D, or the like. Block 812 includes block 814. From block 812, flow proceeds to block 814.

At block 814, CPO patterns are generated over corresponding portions of gate electrodes. Examples of CPO patterns include CPO patterns 474 in FIGS. 4A-4D, or the like. From block 814, flow proceeds to block 816.

At block 816, VD patterns are generated over portions of corresponding MD patterns and/or VG patterns are generated over corresponding portions of gate electrodes. Examples of VD patterns include VD patterns 368 in FIGS. 3C-3D, or the like. Examples of VG patterns include VG patterns 369 in FIGS. 3C-3D, or the like. From block 816, flow proceeds to block 818.

At block 818, M_1st patterns are generated in an M_1st layer. Examples of such M_1st patterns are instances of M_1st patterns 356 of FIGS. 3B, 3C and 3D, 356A_1 and 356A_2 of FIG. 3C, 356B_1 and 356B_2 of FIG. 3D, and 456 of FIGS. 3A and 4A, or the like. Block 818 includes blocks 820-824. From block 818, flow proceeds to a block 820.

At block 820, first and second M_1st patterns are generated as specific instances of the M_1st patterns generated at block 818. Examples of such first and second M_1st patterns include corresponding M_1st patterns 356A_1 and 356A_2 of FIG. 3D, or the like. From block 820, flow proceeds to block 822 or 824.

At block 822, which concerns a circumstance in which the first and second M_1st patterns are designated for corresponding voltage values having a difference equal to or less than a standard voltage, e.g., equal to the first reference value (Vr), the first and second M_1st patterns are separated by a first horizontal gap. Examples of first and second M_1st patterns being separated by a first horizontal gap include first and second M_1st patterns 356B_1 and 356B_2 that are separated by gap 348 in FIG. 3D, or the like.

At block 824, which concerns a circumstance in which the first and second M_1st patterns are designated for corresponding voltage values having a difference greater than a high voltage, e.g., the third reference value (Vh), the first and second M_1st patterns are separated by a second horizontal gap. Examples of first and second M_1st patterns being separated by a second horizontal gap include first and second M_1st patterns 356A_1 and 356A_2 that are separated by gap 349 in FIG. 3C, or the like.

Figure 8B:
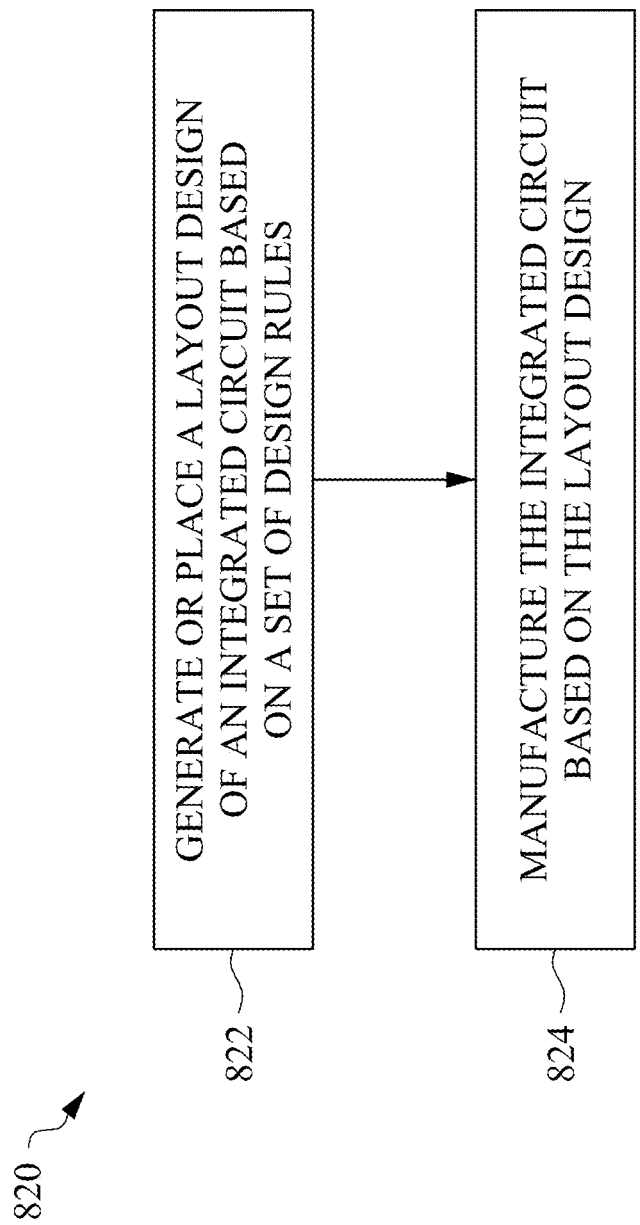
FIG. 8B is a flowchart of a method of manufacturing a semiconductor device, in accordance with some embodiments.

FIG. 8B is a flowchart 820 of a method of manufacturing a semiconductor device, in accordance with some embodiments.

The method of flowchart 820 is implementable, for example, using EDA system 1000 (FIG. 10, discussed below) and an IC, manufacturing system 1100 (FIG. 11, discussed below), in accordance with some embodiments. Examples of a semiconductor device which can be manufactured according to the method of flowchart 820 include semiconductor devices 102 and 202 of corresponding FIGS. 1, 2 and 3E, and semiconductor devices corresponding to various ones of the layout diagrams disclosed herein, or the like.

In FIG. 8B, the method of flowchart 820 includes blocks 822-824. At block 822, a layout diagram is generated which, among other things, includes one or more of layout diagrams disclosed herein, e.g., a layout diagram resulting from the method of flowchart 800 of FIG. 8A, or the like. Block 822 is implementable, for example, using EDA system 1000 (FIG. 10, discussed below), in accordance with some embodiments. From block 820, flow proceeds to block 824.

At block 824, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 1100 in FIG. 11 below.

Figure 9:
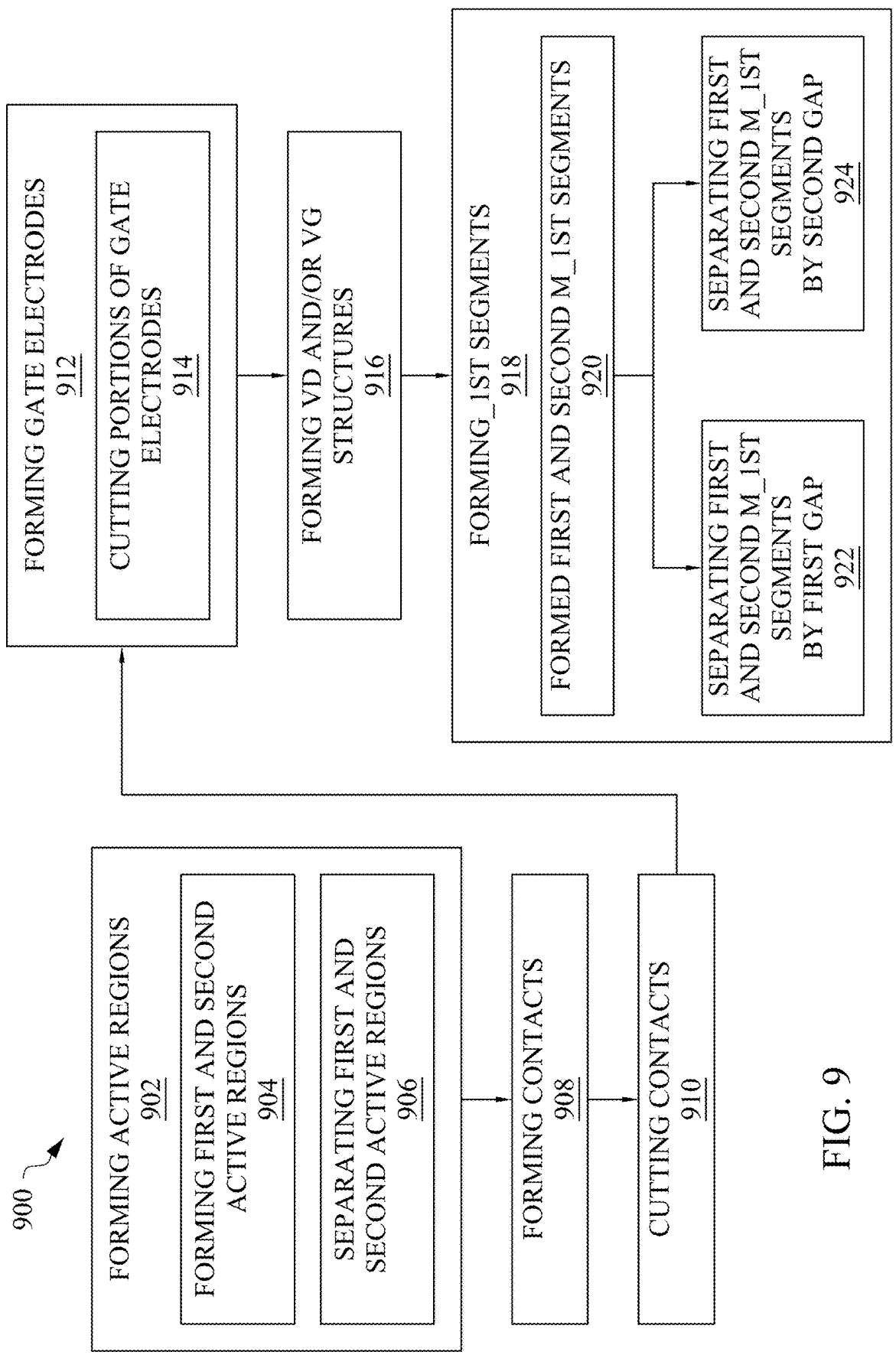
FIG. 9 is a flowchart of a method of manufacturing a semiconductor device, in accordance with some embodiments.

FIG. 9 is a flowchart 900 of a method of manufacturing a semiconductor device, in accordance with some embodiments.

The method of flowchart 900 includes blocks 902-918. At block 902, active regions are formed in a substrate where the active regions extend in the X-axis. Examples of AR patterns in layout diagrams corresponding to active regions in a substrate extending the X-axis include the AR patterns 364, 364A, 464 and 464A of corresponding FIGS. 3C and 4A, or the like. Examples of active regions in a cross sectional diagram of a semiconductor device includes active regions 364A and 364B in FIG. 3E, or the like. Block 902 includes blocks 904-906. From block 902, flow proceeds to block 904.

At block 904, first and second active regions are formed as specific instances of the active regions formed at block 902. Examples of first and second AR patterns in layout diagrams corresponding to active regions in a substrate of a semiconductor device corresponding to the AR structures include AR patterns AR patterns 364 & 364A and 464 & 464A of corresponding FIGS. 3C and 4A, or the like. Examples of first and second active regions in a cross sectional diagram of a semiconductor device includes active regions 364A and 364B in FIG. 3E, or the like. Block 902 includes blocks 904-906. From block 904, flow proceeds to block 906.

At block 906, first and second active regions are separated by a gap. Examples of first and second AR patterns separated by a gap in a layout diagram corresponding to the first and second AR structures separated by a gap include AR patterns 364 and 364A separated by a gap 355 of FIG. 3C, or the like. Examples of first and second active regions separated by a gap in a cross sectional diagram of a semiconductor device includes active regions 364A and 364B separated by gap 355 in FIG. 3E, or the like. From block 906, flow proceeds to block 908.

At block 908, MD structures are formed on the first and second ones of the active regions. Examples of MD patterns in a layout diagram corresponding to the MD structures include MD patterns 346 of FIG. 3A, or the like. Examples of the MD structures in a cross sectional diagram of a semiconductor device include MD structures 346 in FIG. 3E, or the like. From block 908, flow proceeds to block 910.

At block 910, MD structures are cut to remove selected portions of the MD structures. Examples of CMD patterns in layout diagrams which represent voids in MD structures of a semiconductor device resulting from such cuts are include CMD patterns 352 correspondingly on MD patterns 346 of FIG. 3A, or the like. From block 910, flow proceeds to block 912.

At block 912, gate electrodes are formed over corresponding active regions. Examples of gate electrodes in layout diagrams corresponding to gate electrodes in semiconductor devices include gate electrodes 372 in FIG. 3C, 472 in FIGS. 4A-4D, or the like. Examples of gate electrodes in a cross sectional diagram of a semiconductor device include gate electrodes 372 in FIG. 3E. Block 912 includes block 914. From block 912, flow proceeds to block 914.

At block 914, portions of gate electrodes are cut. Examples of CPO patterns in layout diagrams which represent voids in gate electrodes of a semiconductor device resulting from such cuts include CPO patterns 474 in FIGS. 4A-4D, or the like. From block 914, flow proceeds to block 916.

At block 916, VD structures are formed over portions of corresponding MD structures and/or VG patterns are formed over corresponding portions of gate electrodes. Examples of VD patterns in layout diagrams corresponding to VD structures in semiconductor devices include VD patterns 368 in FIGS. 3C-3D, or the like. An example of a VD structure in a cross sectional diagram of a semiconductor device includes MD structure 368 of FIG. 3E, or the like. Examples of VG patterns in layout diagrams corresponding to VG structures in semiconductor devices include VG patterns 369 in FIGS. 3C-3D, or the like. From block 916, flow proceeds to block 918.

At block 918, M_1st segments are formed in an M_1st layer. Examples of M_1st patterns in layout diagrams corresponding to M_1st segments of a semiconductor device are instances of M_1st patterns 356 of FIGS. 3B, 3C and 3D, 356A_1 and 356A_2 of FIG. 3C, 356B_1 and 356B_2 of FIG. 3D, and 456 of FIGS. 3A and 4A, or the like. Examples of M_1st segments in a cross sectional diagram of a semiconductor device include M_1st segments 356A_1 and 356A_2 in FIG. 3E, or the like. Block 918 includes blocks 920-824. From block 918, flow proceeds to a block 920.

At block 920, first and second M_1st segments are formed as specific instances of the M_1st segments formed at block 918. Examples of first and second M_1st patterns in a layout diagram corresponding to M_1st segments of a semiconductor device include corresponding M_1st patterns 356A_1 and 356A_2 of FIG. 3D, or the like. Examples of first and second M_1st segments in a cross sectional diagram of a semiconductor device include corresponding M_1st segments 356A_1 and 356A_2 in FIG. 3E, or the like. From block 920, flow proceeds to block 922 or 924.

At block 922, which concerns a circumstance in which the first and second M_1st segments are designated for corresponding voltage values having a difference equal to or less than a standard voltage, e.g., equal to the first reference value (Vr), the first and second M_1st segments are separated by a first horizontal gap. Examples of first and second M_1st patterns being separated by a first horizontal gap in a layout diagram corresponding to M_1st segments separated by a first horizontal gap in a semiconductor device include first and second M_1st patterns 356B_1 and 356B_2 that are separated by gap 348 in FIG. 3D, or the like.

At block 924, which concerns a circumstance in which the first and second M_1st segments are designated for corresponding voltage values having a difference greater than a high voltage, e.g., the third reference value (Vh), the first and second M_1st segments are separated by a second horizontal gap. Examples of first and second M_1st patterns being separated by a second horizontal gap in a layout diagram corresponding to M_1st segments separated by a second horizontal gap in a semiconductor device include first and second M_1st patterns 356A_1 and 356A_2 that are separated by gap 349 in FIG. 3C, or the like. Examples of first and second M_1st segments in a cross sectional diagram of a semiconductor device that are separated by the second horizontal gap include corresponding M_1st segments 356A_1 and 356A_2 in FIG. 3E separated by gap 349, or the like.

Figure 10:
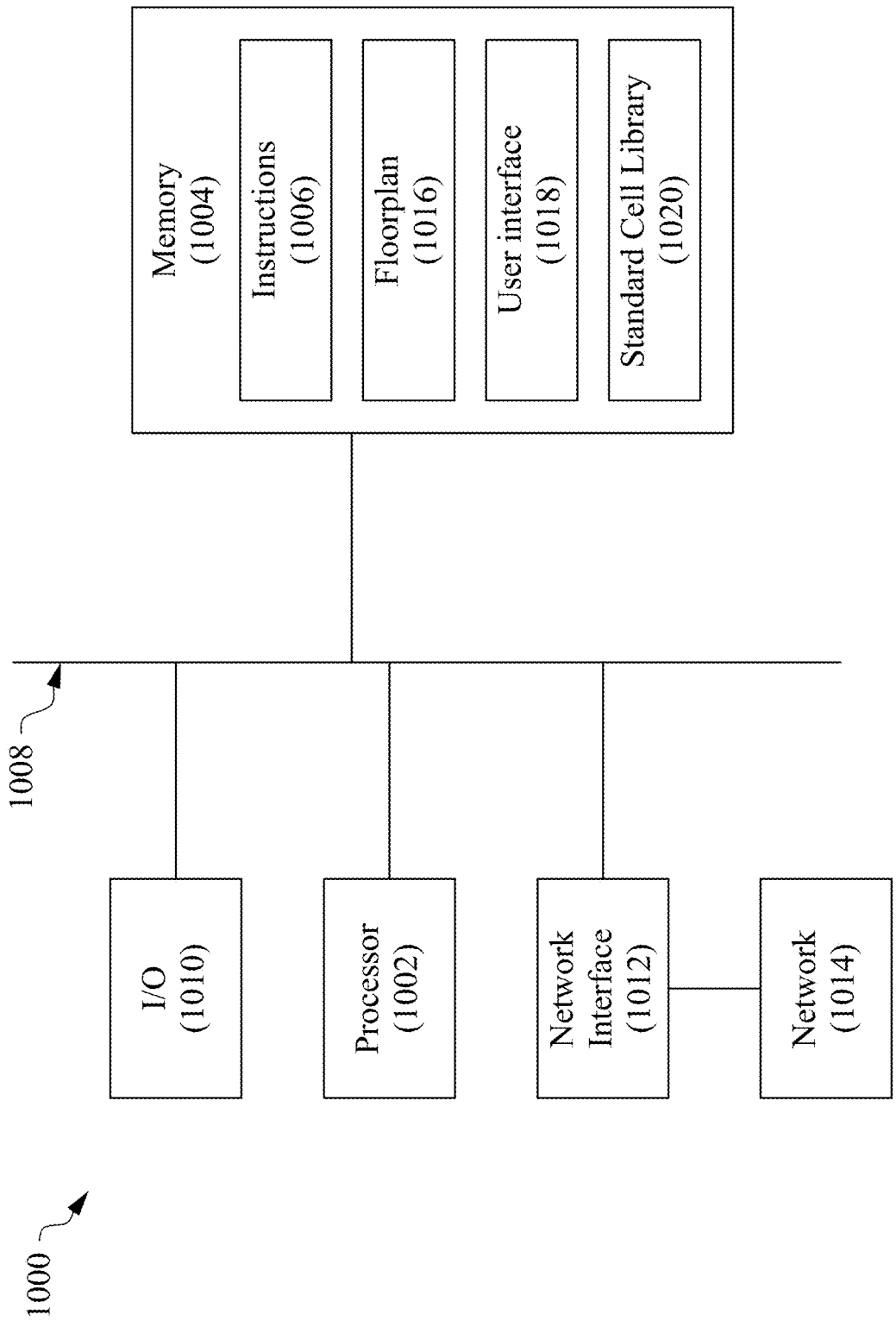
FIG. 10 is a block diagram of an electronic design automation (EDA) system in accordance with some embodiments.

FIG. 10 is a block diagram of an electronic design automation (EDA) system 1000 in accordance with some embodiments.

In some embodiments, EDA system 1000 includes an APR system. The method of flowchart 900 of FIG. 9 is implemented, for example, using EDA system 1000, in accordance with some embodiments, in order to generate an instance of high voltage analog GR and high voltage analog cell structures 100, 200 and 400, or other suitable cell structures are within the contemplated scope of the present disclosure.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of, e.g., the methods of FIGS. 8A, 8B, and 9, in accordance with one or more embodiments (hereinafter, the noted processes and/or methods). Storage medium 1004, amongst other things, stores layout diagram 1016 that includes layout diagrams 302 and 302A, and other layout diagrams of the like within the scope of the present disclosure.

Processor 1002 is electrically coupled to computer-readable storage medium 1004 via a bus 1008. Processor 1002 is further electrically coupled to an I/O interface 1010 by bus 1008. A network interface 1012 is further electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause system 1000 to be usable for performing a portion or all of the noted processes and/or methods. In one or more embodiments, processor 1002 is a central processing unit (CPU), a multi-processor, a distributed processing system, an application specific IC (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause system 1000 (where such execution represents (at least in part) the EDA tool) to be usable for performing a portion or all of the noted processes and/or methods. In one or more embodiments, storage medium 1004 further stores information which facilitates performing a portion or all of the noted processes and/or methods. In one or more embodiments, storage medium 1004 stores library 1020 of standard cells including such standard cells as disclosed herein.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 further includes network interface 1012 coupled to processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1000.

System 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as user interface (UI) 1018.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout which includes standard cells is generated using a tool such as VIR-TUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
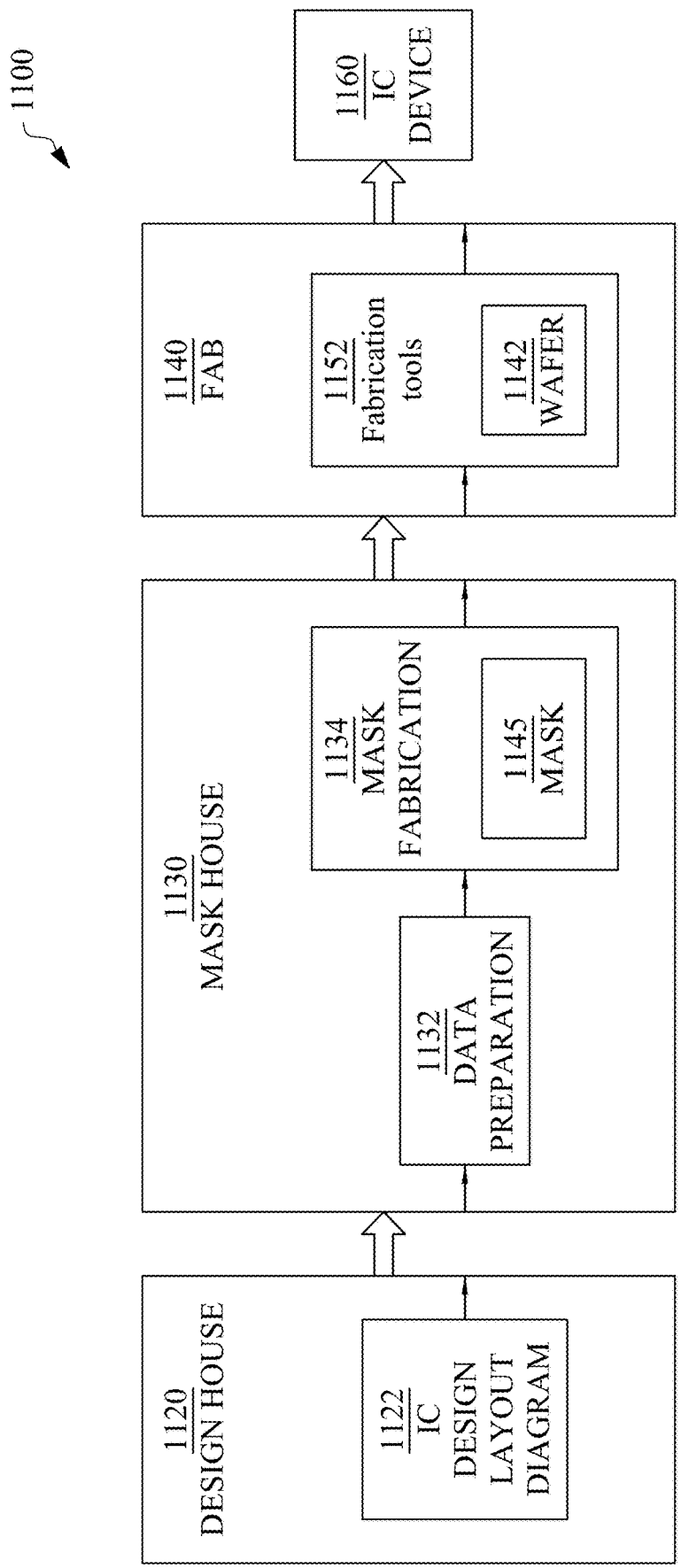
FIG. 11 is a block diagram of an IC manufacturing system, and an IC manufacturing flow associated therewith, in accordance with some embodiments.

FIG. 11 is a block diagram of an IC manufacturing system 1100, and an IC manufacturing flow associated therewith, in accordance with some embodiments.

After block 1616 of FIG. 16B, based on the layout, at least one of (A) one or more semiconductor masks or (B) at least one component in a layer of an inchoate semiconductor IC is fabricated using manufacturing system 1100. In some embodiments, after block 1702 of FIG. 17, based on the layout, at least one of (A) one or more semiconductor masks or (B) at least one component in a layer of an inchoate semiconductor IC is fabricated In FIG. 11, IC manufacturing system 1100 includes entities, such as a design house 1120, a mask house 1130, and an IC manufacturer/fabricator ("fab") 1140, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 1120, mask house 1130, and IC fab 1140 is owned by a single larger company. In some embodiments, two or more of design house 1120, mask house 1130, and IC fab 1140 coexist in a common facility and use common resources.

Design house (or design team) 1120 generates an IC design layout 1122. IC design layout 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout 1122. The design procedure includes one or more of logic design, physical design or place and route. IC design layout 1122 is presented in one or more data files having information of the geometrical patterns. For example, IC design layout 1122 is expressed in a GDSII file format or DFII file format.

Mask house 1130 includes data preparation 1132 and mask fabrication 1134. Mask house 1130 uses IC design layout 1122 to manufacture one or more masks to be used for fabricating the various layers of IC device 1160 according to IC design layout 1122. Mask house 1130 performs mask data preparation 1132, where IC design layout 1122 is translated into a representative data file ("RDF"). Mask data preparation 1132 supplies the RDF to mask fabrication 1134. Mask fabrication 1134 includes a mask writer. A mask writer converts the RDF to an image on a substrate, such as a mask (reticle) or a semiconductor wafer. The design layout is manipulated by mask data preparation 1132 to comply with particular characteristics of the mask writer and/or requirements of IC fab 1140. In FIG. 11, mask data preparation 1132, mask fabrication 1134, and mask 1145 are illustrated as separate elements. In some embodiments, mask data preparation 1132 and mask fabrication 1134 are collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 1132 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1134, which may undo part of the modifications performed by OPC in order to meet mask creation rules.

In some embodiments, mask data preparation 1132 includes lithography process checking (LPC) that simulates processing that will be implemented by IC fab 1140 to fabricate IC device 1160. LPC simulates this processing based on IC design layout 1122 to fabricate a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 1122.

It is understood that the above description of mask data preparation 1132 has been simplified for the purposes of clarity. In some embodiments, data preparation 1132 includes additional features such as a logic operation (LOP) to modify the IC design layout according to manufacturing rules. Additionally, the processes applied to IC design layout 1122 during data preparation 1132 may be executed in a variety of different orders.

After mask data preparation 1132 and during mask fabrication 1134, a mask 1145 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 1134 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1140 is an IC fabrication business that includes one or more manufacturing facilities for the fabrication of a variety of different IC products. In some embodiments, IC fab 1140 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 1140 uses the mask (or masks) fabricated by mask house 1130 to fabricate IC device 1160 using fabrication tools 1152. Thus, IC fab 1140 at least indirectly uses IC design layout 1122 to fabricate IC device 1160. In some embodiments, a semiconductor wafer 1942 is fabricated by IC fab 1140 using the mask (or masks) to form IC device 1160. Semiconductor wafer 1942 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an IC manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method (of manufacturing a semiconductor device) includes: forming M_1st segments in a first metallization layer which are electrically conductive, the forming M_1st segments including: forming first and second M_1st segments for which corresponding long axes extend in a first direction and are substantially collinear, the first and second M_1st segments being free from another instance of M_1st segment being between the first and second M_1st segments; and where the first and second M_1st segments are designated for corresponding voltage values having a difference equal to or less than a reference value, separating the first and second M_1st segments by a first gap; or where the first and second M_1st segments are designated for corresponding voltage values having a difference greater than the reference value, separating the first and second M_1st segments by a second gap, a second size of the second gap being greater than a first size of the first gap. In some embodiments, the forming M_1st segments further includes: forming third and fourth M_1st segments for which corresponding long axes extend in the first direction, the third and fourth M_1st segments overlapping each other relative to the first direction, and the third and fourth M_1st segments being free from another instance of M_1st segment being between the third and fourth M_1st segments relative to a second direction perpendicular to the first direction; and wherein when the third and fourth M_1st segments are designated for corresponding voltage values having a difference equal to or less than the reference value, separating the third and fourth M_1st segments by a third gap relative to the second direction; or wherein when the third and fourth M_1st segments are designated for corresponding voltage values having a difference greater than the reference value, separating the third and fourth M_1st segments by a fourth gap, a fourth size of the fourth gap being greater than a third size of the third gap relative to the second direction. In some embodiments, before the forming M_1st segments, the method further includes: forming active regions in a substrate layer, the substrate layer being below the first metallization layer, the forming active regions including: forming first and second active regions for which corresponding long axes are substantially collinear, the first and second active regions being free from another instance of an active region being between the first and second active regions; and separating the first and second active regions by a third gap, a third size of the third gap being approximately equal to, or greater than, the second size of the second gap. In some embodiments, the forming M_1st segments further includes: forming a first set of M_1st segments including the first M_1st segment, the first set of M_1st segments being substantially above the first active region; forming a second set of M_1st segments including the second M_1st segment, the second set of M_1st segments being substantially above the second active region; and where the first and second sets of M_1st segments are designated for corresponding voltage values having a difference equal to or less than the reference value, separating the first set and the second set by the first gap; or where the first and second sets of M_1st segments are designated for corresponding voltage values having a difference greater than the reference value, separating the first set and the second set by the second gap.

In some embodiments, before the forming M_1st segments and after the forming active regions, the method further includes: forming MD segments in an MD layer which are electrically conductive, the MD layer being over the substrate layer and below the first metallization layer, the MD segments having corresponding long axes extending in a second direction, the second direction being perpendicular to the first direction, and each MD segment being separated from another MD segment in the first direction. In some embodiments, the forming MD segments includes: relative to the second direction, for each of selected ones of the MD segments, removing a portion of the selected MD segment resulting in a pair of first and second MD segments separated by a void, the first and second MD segments being substantially collinear; and for each pair of first and second MD segments, filling a given void of a given pair with dielectric material thereby to electrically isolate the corresponding given first and second MD segments from each other. In some embodiments, before the forming M_1st segments and after the forming MD segments, the method further includes: forming first vias in a first via layer over the MD layer and below the first metallization layer, the first vias electrically connecting one or more of the first MD segments with one or more M_1st segments corresponding to the first MD segments.

In some embodiments, before the forming M_1st segments, the method further includes: forming gate electrodes in a gate layer which are electrically conductive, the gate layer being above the first metallization layer, the gate electrodes extending in a second direction substantially perpendicular to the first direction, and the gate electrodes being separated in the first direction, the forming gate electrodes. In some embodiments, after the forming gate electrodes but before the forming M_1st segments, the method further includes: forming isolation dummy gates correspondingly from selected ones of the gate electrodes that overly ends of corresponding active regions. In some embodiments, the forming isolation dummy gates includes: relative to the second direction, for each of selected ones of the gate electrodes, removing a portion of the selected gate electrode resulting in a pair of corresponding first and second gate electrodes separated by a first void, the corresponding first and second gate electrodes being substantially collinear; and filling the void with one or more dielectric materials.

In some embodiments, a semiconductor device includes: M_1st segments which are electrically conductive, the M_1st segments including: first and second segments that have substantially collinear long axes and are electrically connected to corresponding voltage values having a difference equal to or less than a reference value, the first and second M_1st segments being separated by a first gap; and third and fourth M_1st segments that have substantially collinear long axes and are electrically connected to corresponding voltage values having a difference greater than the reference value, the third and fourth M_1st segments being separated by a second gap, a second size of the second gap being greater than a first size of the first gap.

In some embodiments, the semiconductor device further includes: fifth and sixth M_1st segments for which corresponding long axes extend in the first direction, the fifth and sixth M_1st segments overlapping each other relative to the first direction, and the fifth and sixth M_1st segments being free from another instance of M_1st segment being between the fifth and sixth M_1st segments relative to a second direction perpendicular to the first direction, and the fifth and sixth M_1st segments being electrically connected to corresponding voltage values having a difference equal to or less than the reference value, the fifth and sixth M_1st segments being separated by a third gap relative to the second direction; and seventh and eighth M_1st segments for which corresponding long axes extend in the first direction, the seventh and eighth M_1st segments overlapping each other relative to the first direction, and the seventh and eighth M_1st segments being free from another instance of M_1st segment being between the seventh and eighth M_1st segments relative to the second direction, and the seventh and eighth M_1st segments being electrically connected to corresponding voltage values having a difference greater than the reference value, the seventh and eighth M_1st segments being separated by a fourth gap relative to the second direction, a fourth size of the fourth gap being greater than a third size of the third gap.

In some embodiments, the semiconductor device further includes: active regions in a substrate, the active regions including: first and second active regions for which corresponding long axes extend in a first direction and are substantially collinear, the first and second active regions being free from another instance of active region being between the first and second active regions such that the first and second active regions are separated by a third gap, a third size of the third gap being greater than or equal to the second size of the second gap. In some embodiments, the first M_1st segments further include: a first set of M_1st segments including the first M_1st segment, the first set of M_1st segments being substantially above the first active region; and a second set of M_1st segments including the second M_1st segment, the second set of M_1st segments being substantially above the second active region, the first set of M_1st segments being separated from the second set of M_1st segments by the second gap.

In some embodiments, the semiconductor device further includes: MD segments, the MD segments with corresponding long axes that extend in a second direction, the second direction being perpendicular to the first direction, each MD segment being separated from another MD segment in the first direction, and the MD segments being above the active regions and below the M_1st segments. In some embodiments, the semiconductor device further includes: first vias electrically connecting one or more MD segments with one or more first M_1st segments; and first ends correspondingly of the first M_1st segments being free from overlapping the first vias. In some embodiments, the semiconductor device further includes: gate electrodes which are electrically conductive, the gate electrodes being correspondingly over the first and second active regions, the gate electrodes including: first and second gate electrodes for which corresponding long axes extend in a second direction substantially perpendicular to the first direction and are substantially collinear, the first and second gate electrodes being free from another instance of gate electrode being between the first and second gate electrodes. In some embodiments, the semiconductor device further includes: dielectric material between the first and second gate electrodes to electrically isolate the first and second gate electrodes.

In some embodiments, a semiconductor device includes: a digital section including digital cell regions; an analog active section including analog active cell regions; analog guard ring sections including corresponding analog guard ring cell regions arranged around the analog active section to isolate the analog active section from the digital section; and M_1st segments which are electrically conductive, the M_1st segments including: first and second segments that have substantially collinear long axes and are electrically connected to corresponding voltage values having a difference equal to or less than a reference value, the first and second M_1st segments being separated by a first gap; and third and fourth M_1st segments that have substantially collinear long axes and are electrically connected to corresponding voltage values having a difference greater than the reference value, the third and fourth M_1st segments being separated by a second gap, a second size of the second gap being greater than a first size of the first gap.

In some embodiments, the semiconductor device further includes: fifth and sixth M_1st segments for which corresponding long axes extend in the first direction, the fifth and sixth M_1st segments overlapping each other relative to the first direction, and the fifth and sixth M_1st segments being free from another instance of M_1st segment being between the fifth and sixth M_1st segments relative to a second direction perpendicular to the first direction, and the fifth and sixth M_1st segments being electrically connected to corresponding voltage values having a difference equal to or less than the reference value, the fifth and sixth M_1st segments being separated by a third gap relative to the second direction; and seventh and eighth M_1st segments for which corresponding long axes extend in the first direction, the seventh and eighth M_1st segments overlapping each other relative to the first direction, and the seventh and eighth M_1st segments being free from another instance of M_1st segment being between the seventh and eighth M_1st segments relative to the second direction, the seventh and eighth M_1st segments correspondingly being in a second one of the analog guard ring cell regions and in a second first one of the analog active cell regions, and the seventh and eighth M_1st segments being electrically connected to corresponding voltage values having a difference greater than the reference value, the seventh and eighth M_1st segments being separated by a fourth gap relative to the second direction, a fourth size of the fourth gap being greater than a third size of the third gap.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of manufacturing a semiconductor device, the method comprising:
    forming M_1st segments in a first metallization layer which are electrically conductive, the forming M_1st segments including:
        forming first and second M_1st segments for which corresponding long axes extend in a first direction and are substantially collinear, the first and second M_1st segments being free from another instance of M_1st segment being between the first and second M_1st segments; and
        where the first and second M_1st segments are designated for corresponding voltage values having a difference equal to or less than a reference value, separating the first and second M_1st segments by a first gap; or
        where the first and second M_1st segments are designated for corresponding voltage values having a difference greater than the reference value, separating the first and second M_1st segments by a second gap, a second size of the second gap being greater than a first size of the first gap, wherein:
    before the forming M_1st segments, the method further comprises:
        forming active regions in a substrate layer, the substrate layer being below the first metallization layer, the forming active regions including:
            forming first and second active regions for which corresponding long axes are substantially collinear, the first and second active regions being free from another instance of an active region being between the first and second active regions; and
            separating the first and second active regions by a third gap, a third size of the third gap being approximately equal to, or greater than, the second size of the second gap.

2. The method of claim 1, wherein the forming M_1st segments further includes:

forming third and fourth M_1st segments for which corresponding long axes extend in the first direction, the third and fourth M_1st segments overlapping each other relative to the first direction, and the third and fourth M_1st segments being free from another instance of M_1st segment being between the third and fourth M_1st segments relative to a second direction perpendicular to the first direction; and wherein when the third and fourth M_1st segments are designated for corresponding voltage values having a difference equal to or less than the reference value, separating the third and fourth M_1st segments by a third gap relative to the second direction; or wherein when the third and fourth M_1st segments are designated for corresponding voltage values having a difference greater than the reference value, separating the third and fourth M_1st segments by a fourth gap, a fourth size of the fourth gap being greater than a third size of the third gap relative to the second direction.

3. The method of claim 1, wherein: the reference value is greater than a value of a ground voltage.

4. The method of claim 1, wherein the forming M_1st segments further includes:
forming a first set of M_1st segments including the first M_1st segment, the first set of M_1st segments being substantially above the first active region;
forming a second set of M_1st segments including the second M_1st segment, the second set of M_1st segments being substantially above the second active region; and
where the first and second sets of M_1st segments are designated for corresponding voltage values having a difference equal to or less than the reference value, separating the first set and the second set by the first gap; or
where the first and second sets of M_1st segments are designated for corresponding voltage values having a difference greater than the reference value, separating the first set and the second set by the second gap.

5. The method of claim 1, wherein:
before the forming M_1st segments and after the forming active regions, the method further comprises:
forming MD segments in an MD layer which are electrically conductive, the MD layer being over the substrate layer and below the first metallization layer, the MD segments having corresponding long axes extending in a second direction, the second direction being perpendicular to the first direction, and each MD segment being separated from another MD segment in the first direction.

6. The method of claim 5, wherein the forming MD segments includes:
relative to the second direction, for each of selected ones of the MD segments, removing a portion of the selected MD segment resulting in a pair of first and second MD segments separated by a void, the first and second MD segments being substantially collinear; and
for each pair of first and second MD segments, filling a given void of a given pair with dielectric material thereby to electrically isolate the corresponding given first and second MD segments from each other.

7. The method of claim 6, wherein:
before the forming M_1st segments and after the forming MD segments, the method further comprises:
forming first vias in a first via layer over the MD layer and below the first metallization layer, the first vias electrically connecting one or more of the first MD segments with one or more M_1st segments corresponding to the first MD segments.

8. The method of claim 1, wherein:
before the forming M_1st segments, the method further comprises:
forming gate electrodes in a gate layer which are electrically conductive, the gate layer being above the first metallization layer, the gate electrodes extending in a second direction substantially perpendicular to the first direction, and the gate electrodes being separated in the first direction, the forming gate electrodes.

9. The method of claim 8, wherein,
after the forming gate electrodes but before the forming M_1st segments, the method further comprises:
forming isolation dummy gates correspondingly from selected ones of the gate electrodes that overly ends of corresponding active regions.

10. The method of claim 9, wherein the forming isolation dummy gates includes:
relative to the second direction, for each of selected ones of the gate electrodes, removing a portion of the selected gate electrode resulting in a pair of corresponding first and second gate electrodes separated by a first void, the corresponding first and second gate electrodes being substantially collinear; and
filling the void with one or more dielectric materials.

11. A semiconductor device comprising:
M_1st segments which are electrically conductive, the M_1st segments including:
first and second segments that have substantially collinear long axes and are electrically connected to corresponding voltage values having a difference equal to or less than a reference value, the first and second M_1st segments being separated by a first gap;
third and fourth M_1st segments that have substantially collinear long axes and are electrically connected to corresponding voltage values having a difference greater than the reference value, the third and fourth M_1st segments being separated by a second gap, a second size of the second gap being greater than a first size of the first gap; and
active regions in a substrate, the active regions including:
first and second active regions for which corresponding long axes extend in a first direction and are substantially collinear, the first and second active regions being free from another instance of active region being between the first and second active regions such that the first and second active regions are separated by a third gap, a third size of the third gap being greater than or equal to the second size of the second gap.

12. The semiconductor device of claim 11, further comprising:
fifth and sixth M_1st segments for which corresponding long axes extend in the first direction, the fifth and sixth M_1st segments overlapping each other relative to the first direction, and the fifth and sixth M_1st segments being free from another instance of M_1st segment being between the fifth and sixth M_1st segments relative to a second direction perpendicular to the first direction, and the fifth and sixth M_1st segments being electrically connected to corresponding voltage values having a difference equal to or less than the reference value, the fifth and sixth M_1st segments being separated by a third gap relative to the second direction; and seventh and eighth M_1st segments for which corresponding long axes extend in the first direction, the seventh and eighth M_1st segments overlapping each other relative to the first direction, and the seventh and eighth M_1st segments being free from another instance of M_1st segment being between the seventh and eighth M_1st segments relative to the second direction, and the seventh and eighth M_1st segments being electrically connected to corresponding voltage values having a difference greater than the reference value, the seventh and eighth M_1st segments being separated by a fourth gap relative to the second direction, a fourth size of the fourth gap being greater than a third size of the third gap.

13. The semiconductor device of claim 11, wherein the reference value is greater than a value of a ground voltage.

14. The semiconductor device of claim 11, wherein the first M_1st segments further include:
a first set of M_1st segments including the first M_1st segment, the first set of M_1st segments being substantially above the first active region; and
a second set of M_1st segments including the second M_1st segment, the second set of M_1st segments being substantially above the second active region, the first set of M_1st segments being separated from the second set of M_1st segments by the second gap.

15. The semiconductor device of claim 14, further comprising:
MD segments, the MD segments with corresponding long axes that extend in a second direction, the second direction being perpendicular to the first direction, each MD segment being separated from another MD segment in the first direction, and the MD segments being above the active regions and below the M_1st segments.

16. The semiconductor device of claim 15, further comprising:
first vias electrically connecting one or more MD segments with one or more first M_1st segments; and
first ends correspondingly of the first M_1st segments being free from overlapping the first vias.

17. The semiconductor device of claim 11, further comprising:
gate electrodes which are electrically conductive, the gate electrodes being correspondingly over the first and second active regions, the gate electrodes including:
first and second gate electrodes for which corresponding long axes extend in a second direction substantially perpendicular to the first direction and are substantially collinear, the first and second gate electrodes being free from another instance of gate electrode being between the first and second gate electrodes.

18. The semiconductor device of claim 17, further comprising:
dielectric material between the first and second gate electrodes to electrically isolate the first and second gate electrodes.

19. A semiconductor device comprising:
a digital section including digital cell regions;
an analog active section including analog active cell regions;
analog guard ring sections including corresponding analog guard ring cell regions arranged around the analog active section to isolate the analog active section from the digital section; and
M_1st segments which are electrically conductive, the M_1st segments including:
first and second segments that have substantially collinear long axes and are electrically connected to corresponding voltage values having a difference equal to or less than a reference value, the first and second M_1st segments being separated by a first gap;
third and fourth M_1st segments that have substantially collinear long axes and are electrically connected to corresponding voltage values having a difference greater than the reference value, the third and fourth M_1st segments being separated by a second gap, a second size of the second gap being greater than a first size of the first gap; and
active regions in a substrate, the active regions including:
first and second active regions for which corresponding long axes extend in a first direction and are substantially collinear, the first and second active regions being free from another instance of active region being between the first and second active regions such that the first and second active regions are separated by a third gap, a third size of the third gap being greater than or equal to the second size of the second gap.

20. The semiconductor device of claim 19, further comprising:
fifth and sixth M_1st segments for which corresponding long axes extend in the first direction, the fifth and sixth M_1st segments overlapping each other relative to the first direction, and the fifth and sixth M_1st segments being free from another instance of M_1st segment being between the fifth and sixth M_1st segments relative to a second direction perpendicular to the first direction, and the fifth and sixth M_1st segments being electrically connected to corresponding voltage values having a difference equal to or less than the reference value, the fifth and sixth M_1st segments being separated by a third gap relative to the second direction; and
seventh and eighth M_1st segments for which corresponding long axes extend in the first direction, the seventh and eighth M_1st segments overlapping each other relative to the first direction, and the seventh and eighth M_1st segments being free from another instance of M_1st segment being between the seventh and eighth M_1st segments relative to the second direction, the seventh and eighth M_1st segments correspondingly being in a second one of the analog guard ring cell regions and in a second first one of the analog active cell regions, and the seventh and eighth M_1st segments being electrically connected to corresponding voltage values having a difference greater than the reference value, the seventh and eighth M_1st segments being separated by a fourth gap relative to the second direction, a fourth size of the fourth gap being greater than a third size of the third gap.

* * * * *